United States Patent
Song

(10) Patent No.: US 11,133,070 B2
(45) Date of Patent: Sep. 28, 2021

(54) NONVOLATILE MEMORY DEVICES AND METHODS OF READING THE NONVOLATILE MEMORY DEVICES

(71) Applicant: SK hynix system ic Inc., Chungcheongbuk-do (KR)

(72) Inventor: Hyun Min Song, Sejong-si (KR)

(73) Assignee: SK hynix system ic Inc., Chungcheongbuk-do (KR)

( * ) Notice: Subject to any disclaimer, the term of this patent is extended or adjusted under 35 U.S.C. 154(b) by 0 days.

(21) Appl. No.: 16/902,991

(22) Filed: Jun. 16, 2020

(65) Prior Publication Data

US 2021/0090664 A1 Mar. 25, 2021

(30) Foreign Application Priority Data

Sep. 23, 2019 (KR) .................. 10-2019-0117093

(51) Int. Cl.
| | |
|---|---|
| *G11C 16/10* | (2006.01) |
| *G11C 16/26* | (2006.01) |
| *G11C 16/04* | (2006.01) |
| *G11C 16/34* | (2006.01) |

(52) U.S. Cl.
CPC .......... *G11C 16/26* (2013.01); *G11C 16/0441* (2013.01); *G11C 16/10* (2013.01); *G11C 16/349* (2013.01); *G11C 16/3422* (2013.01)

(58) Field of Classification Search
CPC ..... G11C 16/26; G11C 16/0441; G11C 16/10; G11C 16/3422; G11C 16/349
USPC .................................................. 365/185.02
See application file for complete search history.

(56) References Cited

U.S. PATENT DOCUMENTS 10,468,104 B1 * 11/2019 Anand ............... G11C 16/0466

FOREIGN PATENT DOCUMENTS

| KR | 10-2005-0086376 A | 8/2005 |
|---|---|---|
| KR | 10-2010-0115612 A | 10/2010 |

* cited by examiner

*Primary Examiner* — Xiaochun L Chen
(74) *Attorney, Agent, or Firm* — IP & T Group LLP

(57) ABSTRACT

A nonvolatile memory device includes a nonvolatile memory cell including a first cell transistor and a second cell transistor electrically coupled to a bit line in parallel and configured to respectively have a first physical size and a second physical size, a cell transistor selector coupled between the nonvolatile memory cell and a ground voltage terminal to control electrical connections between the first cell transistor and the ground voltage terminal, and between the second cell transistor and the ground voltage terminal, and a read voltage selection circuit suitable for selectively supplying one of a first read voltage and a second read voltage to the bit line.

25 Claims, 19 Drawing Sheets

NONVOLATILE MEMORY DEVICES AND METHODS OF READING THE NONVOLATILE MEMORY DEVICES

CROSS-REFERENCE TO RELATED APPLICATIONS

The present application claims priority under 35 U.S.C. 119(a) to Korean Application No. 10-2019-0117093, filed on Sep. 23, 2019, which is herein incorporated by references in its entirety.

BACKGROUND

1. Technical Field

Various embodiments of the present disclosure generally relate to nonvolatile memory devices and, more particularly, to nonvolatile memory devices having improved accuracy of a read operation and methods of reading the nonvolatile memory devices.

2. Related Art

Semiconductor memory devices are typically categorized as either random access memory (RAM) devices or read only memory (ROM) devices according to data volatility thereof. The RAM devices are volatile memory devices that lose data stored therein when their power supplies are interrupted. In contrast, the ROM devices are nonvolatile memory devices that retain data stored therein even when their power supplies are interrupted. The ROM devices may also be classified as programmable ROM (PROM) devices or mask ROM devices according to data input methods, that is, data program methods. The PROM devices may be fabricated and sold without programming and may be directly programmed by customers (i.e., users) after fabrication thereof. The mask ROM devices may be programmed during fabrication thereof using implantation masks manufactured based on data requested by users and may then be supplied to the customers or the users. The PROM devices may include one-time PROM (OTPROM) devices, erasable PROM (EPROM) devices and electrically erasable PROM (EEPROM) devices. Once the OTPROM devices are programmed, data in the programmed OTPROM devices cannot be changed. Thus, after the OTPROM devices are programmed, only a read operation may be iteratively performed in the OTPROM devices. While the read operation of the OTPROM devices is iteratively performed, the OTPROM devices may malfunction due to occurrence of a read disturbance phenomenon and degradation of a data retention characteristic.

SUMMARY

According to an embodiment, a nonvolatile memory device includes a nonvolatile memory cell including first and second cell transistors, a cell transistor selector, and a read voltage selection circuit. The first cell transistor and the second cell transistor are electrically coupled to a bit line in parallel and configured to have a first physical size and a second physical size, respectively. The cell transistor selector is coupled between the nonvolatile memory cell and a ground voltage terminal to control electrical connections between the first cell transistor and the ground voltage terminal, and between the second cell transistor and the ground voltage terminal. The read voltage selection circuit is suitable for selectively supplying one of a first read voltage and a second read voltage, to the bit line.

According to another embodiment, a nonvolatile memory device includes a nonvolatile memory cell array, a cell transistor selector, and a read voltage selection circuit. The nonvolatile memory cell array is configured to include first to $M^{th}$ selection gate lines being parallel with rows spaced apart from each other in a column direction, first to $N^{th}$ bit lines intersecting the first to $M^{th}$ selection gate lines spaced apart from each other in a row direction, and a plurality of nonvolatile memory cells located at respective cross points between the first to $M^{th}$ selection gate lines and the first to $N^{th}$ bit lines. Each of the plurality of nonvolatile memory cells includes a first cell transistor having a first physical size and a second cell transistor having a second physical size which are electrically coupled in parallel to a corresponding bit line of the first to $N^{th}$ bit lines and a selection transistor coupled to one of the first to $M^{th}$ selection gate lines to control an electrical connection between the corresponding bit line and the first and second cell transistors. The cell transistor selector is coupled between a ground voltage terminal and the nonvolatile memory cells to control electrical connections between the ground voltage terminal and the first cell transistors, and between the ground voltage terminal and the second cell transistors. The read voltage selection circuit is suitable for selectively supplying one of a first read voltage and a second read voltage to one selected from the first to $N^{th}$ bit lines to perform a read operation of one of the nonvolatile memory cells coupled to the selected bit line.

According to another embodiment, a nonvolatile memory device includes a nonvolatile memory cell array, a cell transistor selector, and a read voltage selection circuit. The nonvolatile memory cell includes a first cell transistor having a first ratio of a first channel width to a first channel length and a second cell transistor having a second ratio of a second channel width to a second channel length, wherein the first ratio does not equal the second ratio. The cell transistor selector is suitable for electrically connecting and electrically disconnecting the first cell transistor and the second cell transistor to a ground voltage terminal. And the read voltage selection circuit is suitable for performing a read operation of the first cell transistor and the second cell transistor selected by the cell transistor selector, to determine whether the nonvolatile memory cell has a programmed status or an initialized status depending on whether the first cell transistor and the second cell transistor are turned on or turned off.

According to yet another embodiment, there is provided a method of reading a nonvolatile memory device including a nonvolatile memory cell, and the nonvolatile memory cell is configured to include a first cell transistor having a first current drivability and a second cell transistor having a second current drivability greater than the first current drivability, both of which are electrically coupled in parallel to a bit line. The method includes performing a first read operation of the first cell transistor using a first read voltage, determining the nonvolatile memory cell to have an initialized status if the first cell transistor is turned off during the first read operation and performing a second read operation of the first cell transistor using a second read voltage greater than the first read voltage if the first cell transistor is turned on during the first read operation, performing a read operation of the second cell transistor using the second read voltage if the first cell transistor is turned off during the second read operation, and determining the nonvolatile memory cell to have the initialized status if the second cell transistor is turned off during the read operation of the second cell transistor and determining the nonvolatile memory cell to have a programmed status if the second cell transistor is turned on during the read operation of the second cell transistor.

These and other features and advantages of the present disclosure will become apparent to those skilled in the art of the invention from the following detailed description in conjunction with the following drawings.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and to describe various principles and advantages of those embodiments.

FIG. 4 is an equivalent circuit diagram illustrating the read voltage selection circuit of FIG. 3 when a first load transistor of the read voltage selection circuit is selectively turned on.

FIG. 5 is an equivalent circuit diagram illustrating the read voltage selection circuit of FIG. 3 when a second load transistor of the read voltage selection circuit is selectively turned on.

FIG. 6 is an equivalent circuit diagram illustrating the read voltage selection circuit of FIG. 3 when a third load transistor of the read voltage selection circuit is selectively turned on.

DETAILED DESCRIPTION OF THE EMBODIMENTS

For the following description of embodiments, it will be understood that the terms "first" and "second" are intended to identify an element, but are not used to define the element itself or imply a particular sequence or hierarchy. In addition, when an element is referred to as being located "on," "over," "above," "under," or "beneath" another element, a relative positional relationship is indicated, regardless of the presence or absence of intervening elements. Accordingly, the terms such as "on," "over," "above," "under," "beneath," "below," and the like that are used herein are for the purpose of describing particular embodiments only and are not intended to limit the scope of the present disclosure. Further, when elements are referred to as being "connected" or "coupled" to one another, the elements may be electrically or mechanically connected or coupled directly without intervening elements or indirectly with intervening elements.

Various embodiments of the present disclosure are directed to nonvolatile memory devices having improved accuracy of a read operation and methods of reading the nonvolatile memory devices.

Figure 1:
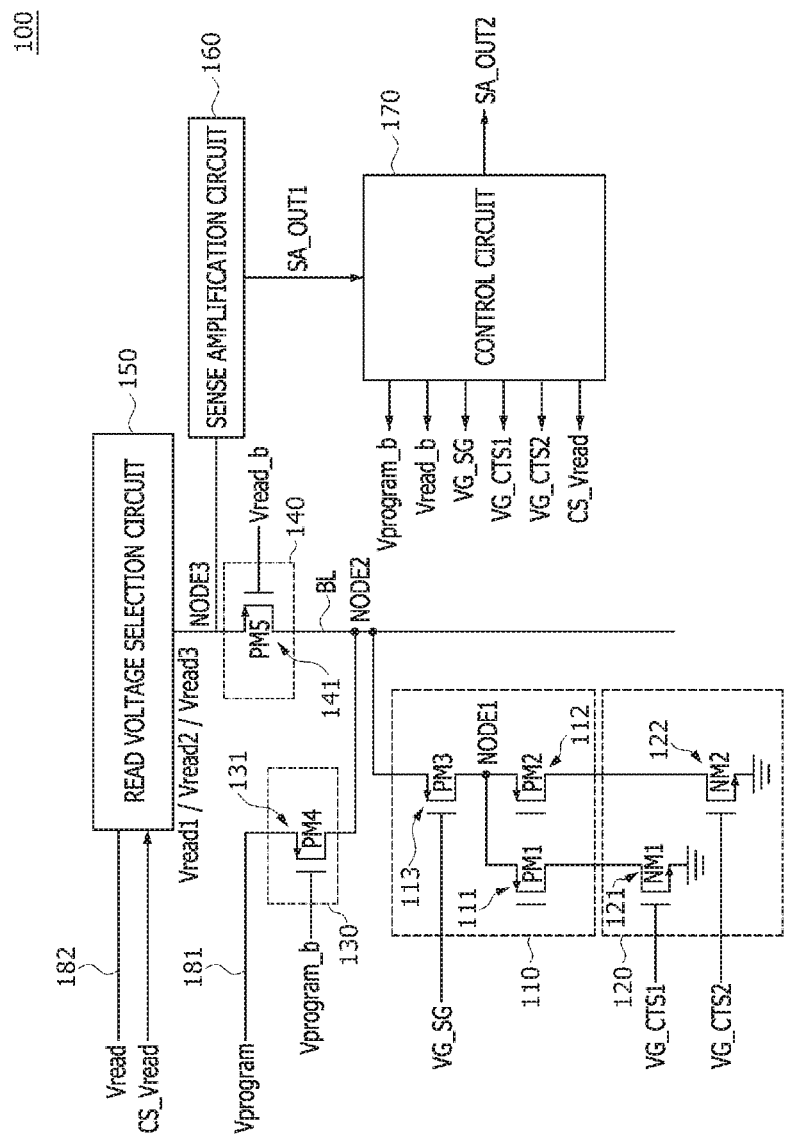
FIG. 1 illustrates a configuration of a nonvolatile memory device according to various embodiments of the present disclosure.

FIG. 1 illustrates a configuration of a nonvolatile memory device 100 according to various embodiments of the present disclosure. Referring to FIG. 1, the nonvolatile memory device 100 may be configured to include a nonvolatile memory cell 110, a cell transistor selector 120, a program switch 130, a read switch 140, a read voltage selection circuit 150, a sense amplification circuit 160, and a control circuit 170. In the present embodiment, the nonvolatile memory cell 110 may be an OTP memory cell. The nonvolatile memory cell 110 may be configured to include a first cell transistor 111, a second cell transistor 112, and a selection transistor 113. In an embodiment, the first cell transistor 111 may be comprised of a first PMOS transistor PM1 having a first floating gate, and the second cell transistor 112 may be comprised of a second PMOS transistor PM2 having a second floating gate. The first and second floating gates may be electrically isolated or insulated from each other. The selection transistor 113 may be comprised of a third PMOS transistor PM3. The first and second cell transistors 111 and 112 may have physical sizes which are different from each other, and this means that a current drivability of the first cell transistor 111 is different from a current drivability of the second cell transistor 112. In the present embodiment, the term "physical size" may indicate a ratio of a channel width to a channel length of a MOS transistor. In an embodiment, the second cell transistor 112 may have a physical size which is greater than a physical size of the first cell transistor 111. Accordingly, a current drivability of the second cell transistor 112 may be greater than a current drivability of the first cell transistor 111.

A source terminal of the first cell transistor 111, a source terminal of the second cell transistor 112, and a drain terminal of the selection transistor 113 may be coupled to a first node NODE1. A source terminal of the selection transistor 113 may be coupled to a second node NODE2 of a bit line BL. A selection gate voltage VG_SG may be applied to a gate terminal of the selection transistor 113. A drain terminal of the first cell transistor 111 may be coupled to a drain terminal of a first switching transistor 121 included in the cell transistor selector 120. A drain terminal of the second cell transistor 112 may be coupled to a drain terminal of a second switching transistor 122 included in the cell transistor selector 120.

The first and second cell transistors 111 and 112 may have an initialized status before the first and second cell transistors 111 and 112 are not programmed by a program operation and may have a programmed status after the program operation of the first and second cell transistors 111 and 112 is performed. In an embodiment, the initialized status of the first and second cell transistors 111 and 112 may indicate a status that the first and second cell transistors 111 and 112 are electrically turned off. In contrast, the programmed status of the first and second cell transistors 111 and 112 may indicate a status that the first and second cell transistors 111 and 112 are electrically turned on. In the present embodiment, the first and second cell transistors 111 and 112 may be simultaneously programmed. If a read voltage is applied to the nonvolatile memory cell 110 having the initialized status during a read operation, a cell current less than a cell current corresponding to the read voltage may flow through the first and second cell transistors 111 and 112 having the initialized status. In contrast, if the read voltage is applied to the nonvolatile memory cell 110 having the programmed status during the read operation, a cell current greater than the cell current corresponding to the read voltage may flow through the first and second cell transistors 111 and 112 having the programmed status.

The cell transistor selector 120 may be coupled between the nonvolatile memory cell 110 and a ground voltage terminal, and may operate to electrically connect or disconnect the first and second cell transistors 111 and 112 to the ground voltage terminal. In an embodiment, the cell transistor selector 120 may be configured to include the first and second switching transistors 121 and 122 which are mentioned above. The first switching transistor 121 may be comprised of a first NMOS transistor NM1, and the second switching transistor 122 may be comprised of a second NMOS transistor NM2. A drain terminal of the first switching transistor 121 may be coupled to a drain terminal of the first cell transistor 111. A source terminal of the first switching transistor 121 may be coupled to the ground voltage terminal. A first switching gate voltage VG_CTS1 may be applied to a gate terminal of the first switching transistor 121. A drain terminal of the second switching transistor 122 may be coupled to a drain terminal of the second cell transistor 112. A source terminal of the second switching transistor 122 may be coupled to the ground voltage terminal. A second switching gate voltage VG_CTS2 may be applied to a gate terminal of the second switching transistor 122.

The first cell transistor 111 may be electrically connected to or disconnected from the ground voltage terminal according to a magnitude of the first switching gate voltage VG_CTS1. In an embodiment, if the first switching gate voltage VG_CTS1 having a high level is applied to the gate terminal of the first switching transistor 121, the first switching transistor 121 may be turned on to electrically connect the first cell transistor 111 of the nonvolatile memory cell 110 to the ground voltage terminal. In contrast, if the first switching gate voltage VG_CTS1 having a low level is applied to the gate terminal of the first switching transistor 121, the first switching transistor 121 may be turned off to electrically disconnect the first cell transistor 111 of the nonvolatile memory cell 110 from the ground voltage terminal. Similarly, if the second switching gate voltage VG_CTS2 having a high level is applied to the gate terminal of the second switching transistor 122, the second switching transistor 122 may be turned on to electrically connect the second cell transistor 112 of the nonvolatile memory cell 110 to the ground voltage terminal. In contrast, if the second switching gate voltage VG_CTS2 having a low level is applied to the gate terminal of the second switching transistor 122, the second switching transistor 122 may be turned off to electrically disconnect the second cell transistor 112 of the nonvolatile memory cell 110 from the ground voltage terminal.

The program switch 130 may be coupled between a program voltage supply line 181 for supplying a program voltage Vprogram, and the second node NODE2 of the bit line BL. The program switch 130 may include a program switching transistor 131. In the present embodiment, the program switching transistor 131 may function as a switching transistor for applying the program voltage Vprogram to the second node NODE2 during the program operation, and a load resistance value of the program switching transistor 131 will be neglected hereinafter. In an embodiment, the program switching transistor 131 may be comprised of a fourth PMOS transistor PM4. A source terminal of the program switching transistor 131 may be coupled to the program voltage supply line 181. A drain terminal of the program switching transistor 131 may be coupled to the second node NODE2 of the bit line BL. A program gate voltage Vprogram_b may be applied to a gate terminal of the program switching transistor 131.

The read switch 140 may be coupled between the second node NODE2 of the bit line BL and a third node NODE3 of the bit line BL. The third node NODE3 of the bit line BL may be coupled to an output line of the read voltage selection circuit 150 for generating various read voltages, for example, first to third read voltages Vread1, Vread2 and Vread3. The read switch 140 may include a read switching transistor 141. In the present embodiment, the read switching transistor 141 may function as a switching transistor for applying one selected from the read voltages Vread1, Vread2 and Vread3 to the second node NODE2 of the bit line BL during the read operation, and a load resistance value of the read switching transistor 141 will be neglected hereinafter. In an embodiment, the read switching transistor 141 may be comprised of a fifth PMOS transistor PM5. A source terminal of the read switching transistor 141 may be coupled to the third node NODE3 of the bit line BL, that is, the output line of the read voltage selection circuit 150. A drain terminal of the read switching transistor 141 may be coupled to the second node NODE2 of the bit line BL. A read gate voltage Vread_b may be applied to a gate terminal of the read switching transistor 141.

The read voltage selection circuit 150 may be coupled between a read voltage supply line 182 for supplying a read voltage Vread, and the third node NODE3 of the bit line BL. The read voltage selection circuit 150 may receive a read voltage selection control signal CS_Vread. The read voltage selection circuit 150 may selectively output one of the first to third read voltages Vread1, Vread2 and Vread3 in response to the read voltage selection control signal CS_Vread. The first to third read voltages Vread1, Vread2 and Vread3 may have voltage levels which are lower than a voltage level of the read voltage Vread supplied through the read voltage supply line 182. The first to third read voltages Vread1, Vread2 and Vread3 may have different voltage levels. In an embodiment, the first read voltage Vread1 may have a lowest voltage level among voltage levels of the first to third read voltages Vread1, Vread2 and Vread3. The second read voltage Vread2 may have a voltage level which is higher than a voltage level of the first read voltage Vread1. The third read voltage Vread3 may have a highest voltage level among the voltage levels of the first to third read voltages Vread1, Vread2 and Vread3.

The first and second read voltages Vread1 and Vread2 may be used during the read operation of the nonvolatile memory cell 110. Specifically, the read operation for the first cell transistor 111 having a relatively small current drivability may be performed a first time using the first read voltage Vread1 having a relatively low voltage level. If a status of the nonvolatile memory cell 110 is affected by read disturbance or retention degradation after the read operation for the first cell transistor 111 (i.e., a read disturbance or retention degradation of the first cell transistor 111 is suspected after the read operation for the first cell transistor 111), the read operation for the first cell transistor 111 may be performed again using the second read voltage Vread2 having a relatively high voltage level. If a status of the nonvolatile memory cell 110 is affected by read disturbance or retention degradation even after the second read operation for the first cell transistor 111, the read operation for the second cell transistor 112 having a relatively larger current drivability may be performed using the second read voltage Vread2 having a relatively high voltage level. In the present disclosure, the read disturbance may be defined as a phenomenon that a cell current of a cell transistor having the initialized status increases due to a usage of a high read voltage or an increase of frequency of the read operations. In addition, the retention degradation may be defined as a phenomenon that a cell current of a cell transistor having the programmed status is reduced due to a loss of electrons stored in a gate (i.e., a floating gate) of the programmed cell transistor when the temperature rises.

Furthermore, the third read voltage Vread3 may be used to verify the programmed status of the nonvolatile memory cell 110 after the nonvolatile memory cell 110 is programmed by the program operation. That is, the program operation of the nonvolatile memory cell 110 may be performed such that both of a cell current of the first cell transistor 111 and a cell current of the second cell transistor 112, are greater than a cell current corresponding to the third read voltage Vread3. Thus, after the program operation is performed, a program verifying operation may be performed to verify whether the first and second cell transistors 111 and 112 of the nonvolatile memory cell 110 are appropriately programmed. The program verifying operation may be achieved by performing the read operation on each of the first and second cell transistors 111 and 112 of the nonvolatile memory cell 110 with the third read voltage Vread3 to determine whether a cell current greater than a current corresponding to the third read voltage Vread3 flows through each of the first and second cell transistors 111 and 112.

The sense amplification circuit 160 may receive a node voltage of the third node NODE3 of the bit line BL as a sensing input voltage during the read operation of the nonvolatile memory cell 110. In an embodiment, the sense amplification circuit 160 may be realized using a CMOS inverter. For example, the sense amplification circuit 160 may be configured to include a pull-up PMOS transistor coupled between a power supply voltage terminal and an output line of the sense amplification circuit 160 and a pull-down NMOS transistor coupled between the output line of the sense amplification circuit 160 and the ground voltage terminal. The node voltage of the third node NODE3 of the bit line BL may be applied to both of a gate terminal of the pull-up PMOS transistor and a gate terminal of the pull-down NMOS transistor. In an embodiment, when the nonvolatile memory cell 110 has the initialized status, the sense amplification circuit 160 may output a low level signal, for example, the ground voltage as a first sensing output signal SA_OUT1. In contrast, when the nonvolatile memory cell 110 has the programmed status, the sense amplification circuit 160 may output a high level signal, for example, the power supply voltage as the first sensing output signal SA_OUT1. The first sensing output signal SA_OUT1 outputted from the sense amplification circuit 160 may be inputted to the control circuit 170.

The control circuit 170 may generate various gate voltages and control signals applied to gate terminals of various transistors to perform the program operation and the read operation of the nonvolatile memory cell 110. In an embodiment, the control circuit 170 may generate the selection gate voltage VG_SG applied to the gate terminal of the selection transistor 113 included in the nonvolatile memory cell 110. The control circuit 170 may generate the first switching gate voltage VG_CTS1 applied to the gate terminal of the first switching transistor 121 included in the cell transistor selector 120. The control circuit 170 may generate the second switching gate voltage VG_CTS2 applied to the gate terminal of the second switching transistor 122 included in the cell transistor selector 120. The control circuit 170 may generate the program gate voltage Vprogram_b applied to the gate terminal of the program switching transistor 131 included in the program switch 130 to perform the program operation of the nonvolatile memory cell 110. The control circuit 170 may generate the read gate voltage Vread_b applied to the gate terminal of the read switching transistor 141 included in the read switch 140 and the read voltage selection control signal CS_Vread inputted to the read voltage selection circuit 150 to perform the read operation of the nonvolatile memory cell 110.

The control circuit 170 may generate the various gate voltages and the read voltage selection control signal CS_Vread according to a level of the selected read voltage outputted from the read voltage selection circuit 150 and a level of the first sensing output signal SA_OUT1 outputted from the sense amplification circuit 160, during the read operation of the nonvolatile memory cell 110. If the read operation of the nonvolatile memory cell 110 terminates, the control circuit 170 may output a second sensing output signal SA_OUT2. In an embodiment, when the nonvolatile memory cell 110 has the initialized status, the control circuit 170 may output a low level signal as the second sensing output signal SA_OUT2. In contrast, when the nonvolatile memory cell 110 has the programmed status, the control circuit 170 may output a high level signal as the second sensing output signal SA_OUT2.

Figure 2:
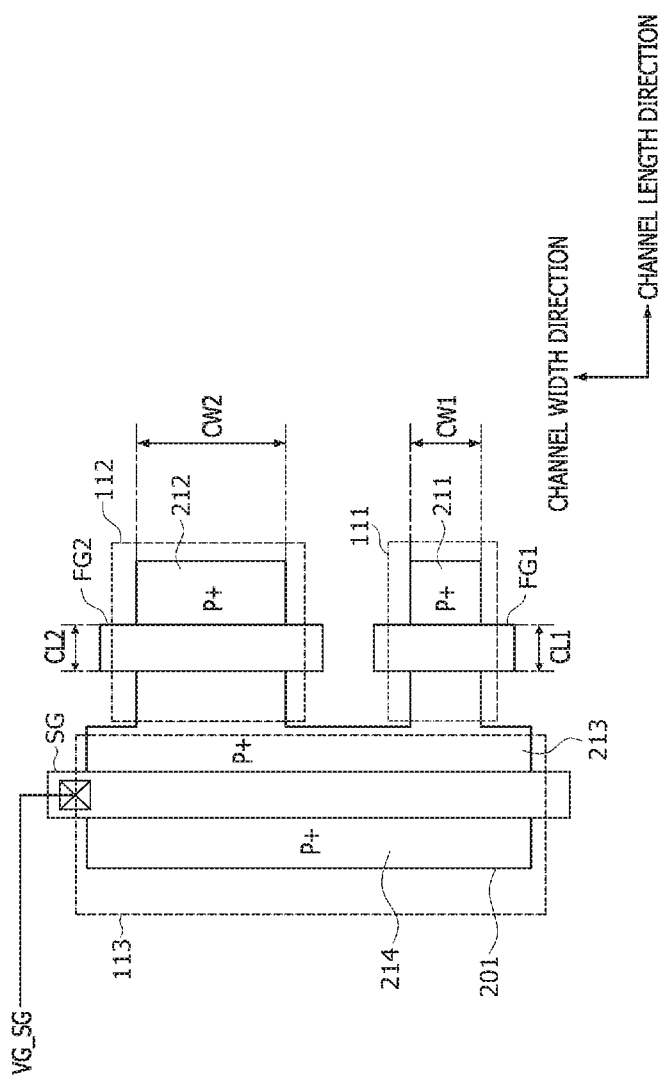
FIG. 2 is a layout diagram illustrating a first cell transistor and a second cell transistor included in a nonvolatile memory device according to various embodiments of the present disclosure.

FIG. 2 is a layout diagram illustrating the first cell transistor 111, the second cell transistor 112 and the selection transistor 113 included in the nonvolatile memory device 100 of FIG. 1. As illustrated in FIG. 2, the first cell transistor 111, the second cell transistor 112 and the selection transistor 113 may share one active region 201, which is defined in a semiconductor substrate (not shown), with each other. Although not shown in the drawings, the active region 201 may be disposed in an N-type well region formed in the semiconductor substrate. The first cell transistor 111 may be disposed in a first region of the active region 201. The second cell transistor 112 may be disposed in a second region of the active region 201. The selection transistor 113 may be disposed in a third region of the active region 201. A first floating gate FG1 corresponding to a floating gate of the first cell transistor 111 may be disposed to intersect the first region of the active region 201 and to extend along a channel width direction (i.e., a vertical direction in FIG. 2). Accordingly, a first impurity region 211 and a third impurity region 213 may be disposed in the first region of the active region 201 and are separated from each other by the first floating gate FG1 along a channel length direction (i.e., a horizontal direction in FIG. 2). A second floating gate FG2 corresponding to a floating gate of the second cell transistor 112 may be disposed to intersect the second region of the active region 201 and to extend along the channel width direction. Accordingly, a second impurity region 212 and the third impurity region 213 may be disposed in the second region of the active region 201 and are separated from each other by the second floating gate FG2 along the channel length direction.

A selection gate SG corresponding to the gate terminal of the selection transistor 113 may be disposed to intersect the third region of the active region 201 and to extend along the channel width direction. Accordingly, a fourth impurity region 214 and the third impurity region 213 may be disposed in the third region of the active region 201 and are separated from each other by the selection gate SG along the channel length direction. The first cell transistor 111, the second cell transistor 112 and the selection transistor 113 may share the third impurity region 213 with each other. As described with reference to FIG. 1, if all of the first cell transistor 111, the second cell transistor 112 and the selection transistor 113 are implemented using PMOS transistors, the first to fourth impurity regions 211, 212, 213 and 214 may be P-type impurity regions.

The first impurity region 211 may correspond to a drain region of the first cell transistor 111. The second impurity region 212 may correspond to a drain region of the second cell transistor 112. Although not shown in FIG. 2, the first impurity region 211 and the second impurity region 212 may be electrically coupled to a drain region of the first switching transistor 121 and a drain region of the second switching transistor 122, respectively. The third impurity region 213 may correspond to a source region of the first cell transistor 111, a source region of the second cell transistor 112, and a drain region of the selection transistor 113. The fourth impurity region 214 may correspond to a source region of the selection transistor 113.

A portion of the active region 201 overlapping with the first floating gate FG1 may function as a first channel region corresponding to a channel region of the first cell transistor 111. A portion of the active region 201 overlapping with the second floating gate FG2 may function as a second channel region corresponding to a channel region of the second cell transistor 112. A first channel length CL1 corresponding to a channel length of the first channel region of the first cell transistor 111 may be substantially equal to a second channel length CL2 corresponding to a channel length of the second channel region of the second cell transistor 112. That is, there may be no difference in current drivability between the first and second cell transistors 111 and 112 in terms of a channel length. However, a second channel width CW2 corresponding to a channel width of the second channel region of the second cell transistor 112 may be greater than a first channel with CW1 corresponding to a channel width of the first channel region of the first cell transistor 111. Thus, a current drivability of the second cell transistor 112 may be actually greater than a current drivability of the first cell transistor 111 due to a difference between the first and second channel widths CW1 and CW2. That is, the second cell transistor 112 may have a current drivability which is greater than a current drivability of the first cell transistor 111 because the first and second channel lengths CL1 and CL2 are equal to each other and the second channel width CW2 is greater than the first channel width CW1.

Figure 3:
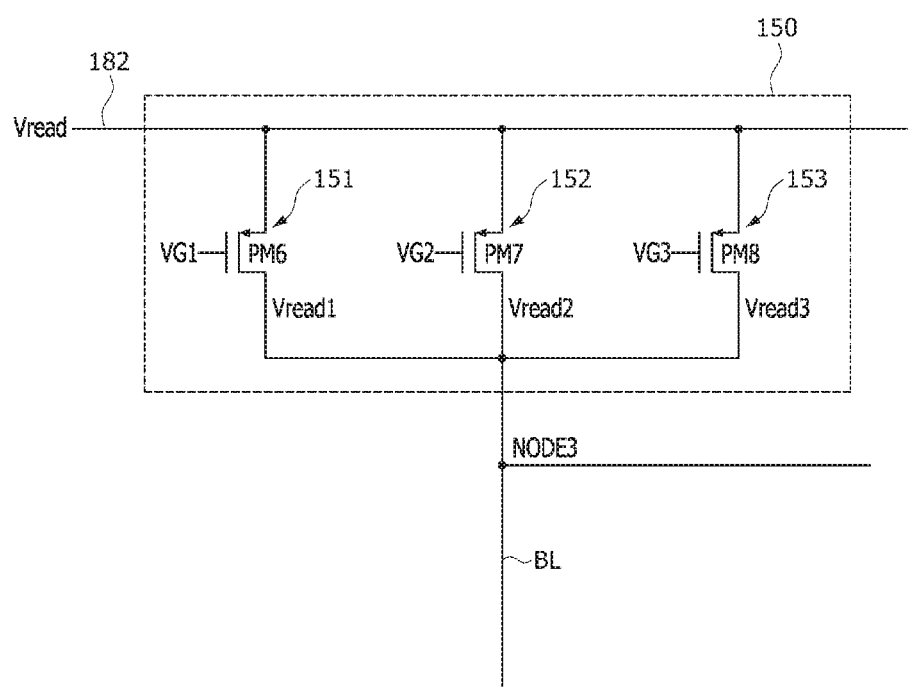
FIG. 3 is a circuit diagram illustrating a configuration of a read voltage selection circuit included in a nonvolatile memory device according to various embodiments of the present disclosure.
Figure 4:
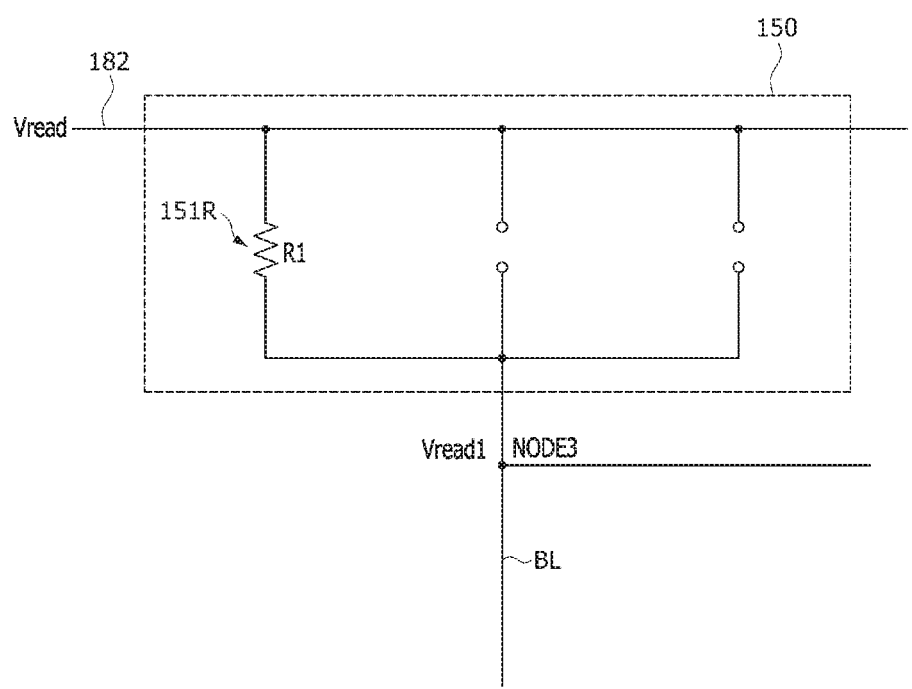
Figure 5:
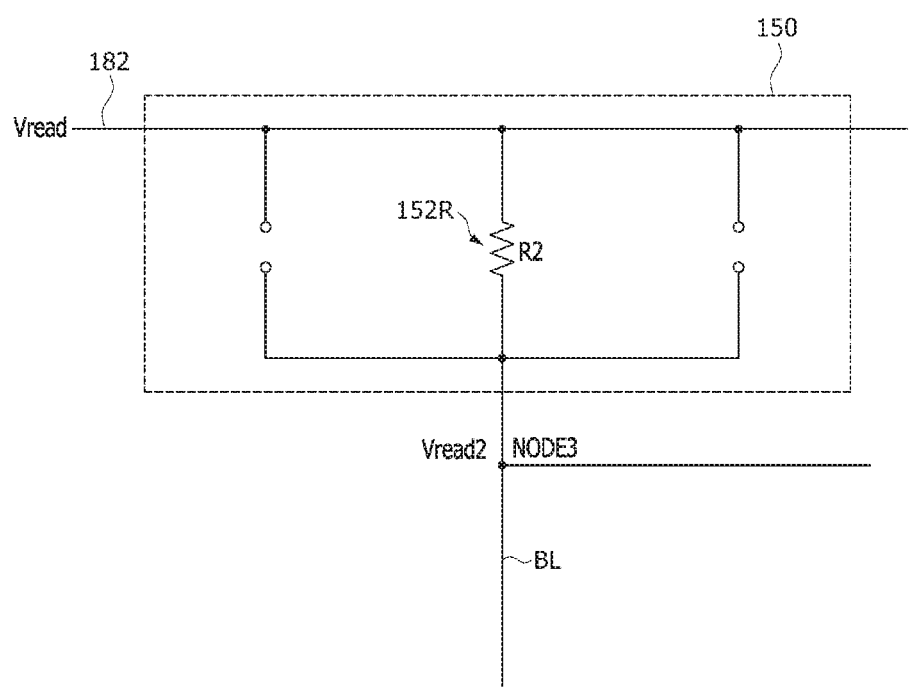
Figure 6:
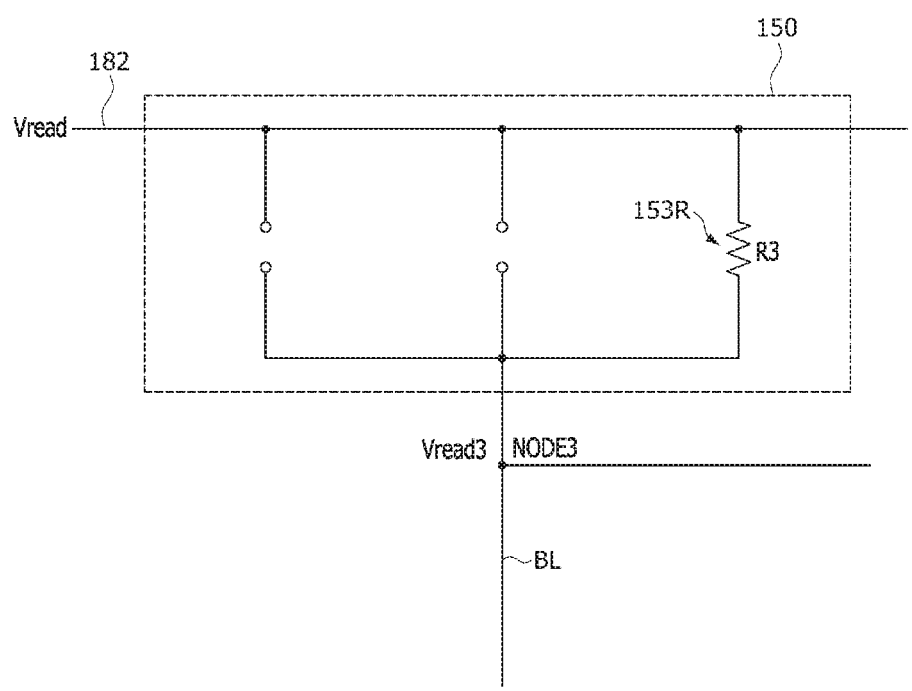

FIG. 3 is a circuit diagram illustrating a configuration of the read voltage selection circuit 150 included in the nonvolatile memory device 100 of FIG. 1. FIGS. 4 to 6 are equivalent circuit diagrams illustrating examples in which the read voltage selection circuit 150 outputs the first, second and third read voltages Vread1, Vread2 and Vread3, respectively. First, as illustrated in FIG. 3, the read voltage selection circuit 150 may be configured to include a first load transistor 151, a second load transistor 152 and a third load transistor 153. In an embodiment, the first load transistor 151 may be comprised of a sixth PMOS transistor PM6, and the second load transistor 152 may be comprised of a seventh PMOS transistor PM7. In addition, the third load transistor 153 may be comprised of an eighth PMOS transistor PM8.

The first, second and third load transistors 151, 152 and 153 may act as load resistors and switches. The first, second and third load transistors 151, 152 and 153 may have different physical sizes, for example, different channel ratios, each of which is defined as a ratio of a channel width to a channel length. Thus, the first, second and third load transistors 151, 152 and 153 may have different load resistance values. In an embodiment, the first load transistor 151 may have a highest load resistance value among load resistance values of the first, second and third load transistors 151, 152 and 153. The second load transistor 152 may have a load resistance value which is lower than a load resistance value of the first load transistor 151. The third load transistor 153 may have a lowest load resistance value among the load resistance values of the first, second and third load transistors 151, 152 and 153. In an embodiment, when the first, second and third load transistors 151, 152 and 153 have the same channel length, the third load transistor 153 may have a widest channel width among the first, second and third load transistors 151, 152 and 153 and the first load transistor 151 may have a narrowest channel width among the first, second and third load transistors 151, 152 and 153. In an embodiment, when the first, second and third load transistors 151, 152 and 153 have the same channel width, the third load transistor 153 may have a shortest channel length among the first, second and third load transistors 151, 152 and 153 and the first load transistor 151 may have a longest channel length among the first, second and third load transistors 151, 152 and 153.

All source terminals of the first, second and third load transistors 151, 152 and 153 may be coupled to the read voltage supply line 182 which supplies the read voltage Vread. All drain terminals of the first, second and third load transistors 151, 152 and 153 may be coupled to an output line of the read voltage selection circuit 150, that is, the third node NODE3 of the bit line BL. A first gate voltage VG1 may be applied to a gate terminal of the first load transistor 151. A second gate voltage VG2 may be applied to a gate terminal of the second load transistor 152. A third gate voltage VG3 may be applied to a gate terminal of the third load transistor 153. The first to third gate voltages VG1, VG2 and VG3 may constitute the read voltage selection control signal (CS_Vread of FIG. 1) which is inputted to the read voltage selection circuit 150.

FIG. 4 illustrates an equivalent circuit diagram of the read voltage selection circuit 150 when the first load transistor 151 is selectively turned on. If the first gate voltage VG1 having a low level is applied to the gate terminal of the first load transistor 151, the first load transistor 151 may be turned on. As illustrated in FIG. 4, the first load transistor 151, when turned on, may act as a first load resistor 151R having a first equivalent resistance value R1. Furthermore, the second and third gate voltages VG2 and VG3 having a high level may be applied to the gate terminals of the second and third load transistors 152 and 153, respectively. Thus, the second and third load transistors 152 and 153 may be turned off to act as open circuits. In such a case, a voltage drop across the first load resistor 151R may occur because of a current flowing through the first load resistor 151R under a bias condition when the read voltage Vread is applied to the read voltage supply line 182. Thus, the first read voltage Vread1 may be induced at the third node NODE3 of the bit line BL through the output line of the read voltage selection circuit 150. The first read voltage Vread1 may have a magnitude corresponding to a voltage obtained by subtracting the voltage drop across the first load resistor 151R from the read voltage Vread.

FIG. 5 illustrates an equivalent circuit diagram of the read voltage selection circuit 150 when the second load transistor 152 is selectively turned on. If the second gate voltage VG2 having a low level is applied to the gate terminal of the second load transistor 152, the second load transistor 152 may be turned on. As illustrated in FIG. 5, the second load transistor 152, when turned on, may act as a second load resistor 152R having a second equivalent resistance value R2. Furthermore, the first and third gate voltages VG1 and VG3 having a high level may be applied to the gate terminals of the first and third load transistors 151 and 153, respectively. Thus, the first and third load transistors 151 and 153 may be turned off to act as open circuits. In such a case, a voltage drop across the second load resistor 152R may occur because of a current flowing through the second load resistor 152R under a bias condition when the read voltage Vread is applied to the read voltage supply line 182. Thus, the second read voltage Vread2 may be induced at the third node NODE3 of the bit line BL through the output line of the read voltage selection circuit 150. The second read voltage Vread2 may have a magnitude corresponding to a voltage obtained by subtracting the voltage drop across the second load resistor 152R from the read voltage Vread. Because the second equivalent resistance value R2 of the second load transistor 152 is less than the first equivalent resistance value R1 of the first load transistor 151, the second read voltage Vread2 may be higher than the first read voltage Vread1.

FIG. 6 illustrates an equivalent circuit diagram of the read voltage selection circuit 150 when the third load transistor 153 is selectively turned on. As described with reference to FIG. 1, the third load transistor 153 is selectively turned on to perform the program verifying operation after the program operation. If the third gate voltage VG3 having a low level is applied to the gate terminal of the third load transistor 153, the third load transistor 153 may be turned on. As illustrated in FIG. 6, the third load transistor 153, when turned on, may act as a third load resistor 153R having a third equivalent resistance value R3. Moreover, the first and second gate voltages VG1 and VG2 having a high level may be applied to the gate terminals of the first and second load transistors 151 and 152, respectively. Thus, the first and second load transistors 151 and 152 may be turned off to act as open circuits. In such a case, a voltage drop across the third load resistor 153R may occur because of a current flowing through the third load resistor 153R under a bias condition that the read voltage Vread is applied to the read voltage supply line 182. Thus, the third read voltage Vread3 may be induced at the third node NODE3 of the bit line BL through the output line of the read voltage selection circuit 150. The third read voltage Vread3 may have a magnitude corresponding to a voltage obtained by subtracting the voltage drop across the third load resistor 153R from the read voltage Vread. Because the third equivalent resistance value R3 of the third load transistor 153 is less than the second equivalent resistance value R2 of the second load transistor 152, the third read voltage Vread3 may be higher than the second read voltage Vread2.

Figure 7:
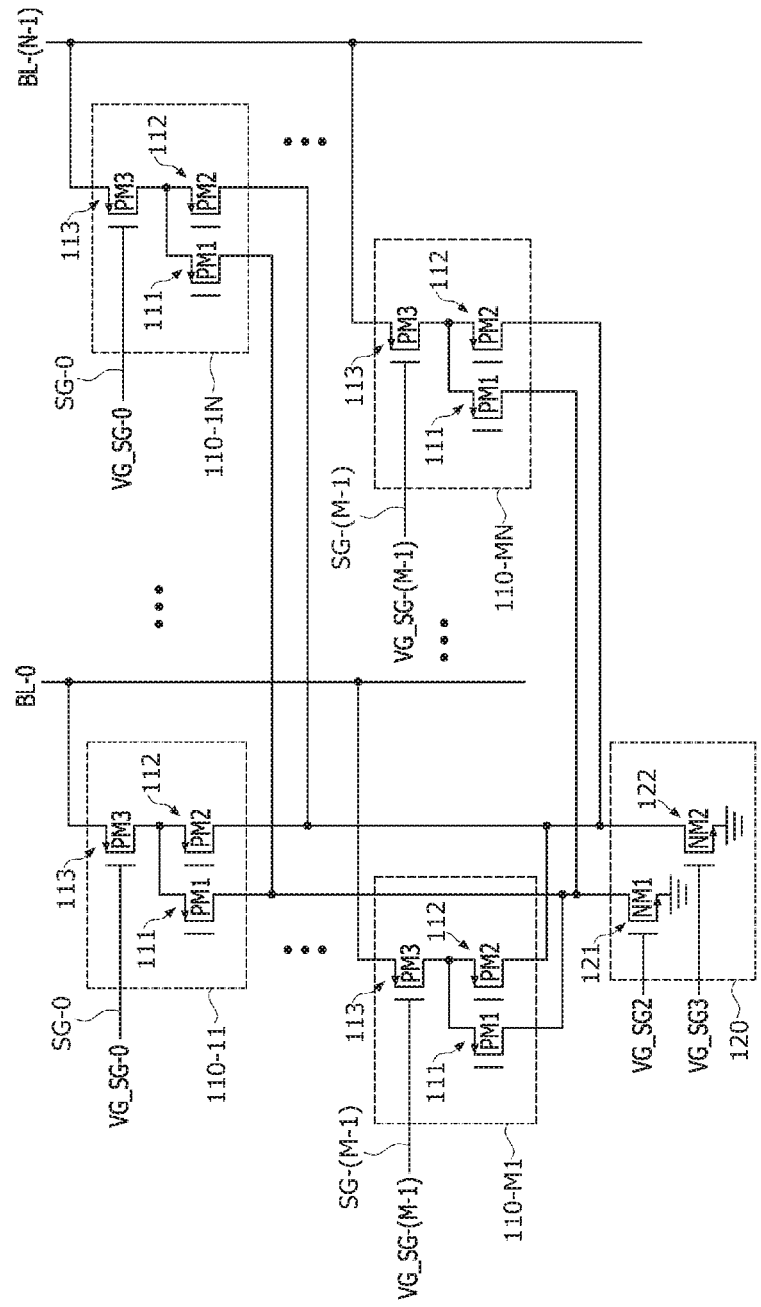
FIG. 7 is an equivalent circuit diagram illustrating a nonvolatile memory cell array of a nonvolatile memory device according to various embodiments of the present disclosure.

FIG. 7 is an equivalent circuit diagram illustrating a nonvolatile memory cell array in a nonvolatile memory device according to various embodiments of the present disclosure. Referring to FIG. 7, the nonvolatile memory cell array may be configured to include a plurality of nonvolatile memory cells, for example, first to $(M \times N)^{th}$ nonvolatile memory cells 110-11, . . . , 110-1N, . . . , 110-M1, . . . , and 110-MN and the cell transistor selector 120. Although not shown in FIG. 7, the nonvolatile memory device according to an embodiment may include the nonvolatile memory cell array, the program switch (130 of FIG. 1), the read switch (140 of FIG. 1), the read voltage selection circuit (150 of FIG. 1), the sense amplification circuit (160 of FIG. 1), and the control circuit (170 of FIG. 1). The first to $(M \times N)^{th}$ nonvolatile memory cells 110-11, . . . , 110-1N, . . . , 110-M1, . . . , and 110-MN may be located at cross points between a plurality of bit lines (e.g., first to $N^{th}$ bit lines BL-0, . . . and BL-(N−1)) disposed in a row direction (a horizontal direction in FIG. 7) spaced apart from each other and a plurality of selection gate lines (e.g., first to $M^{th}$ selection gate lines SG-0, . . . and SG-(M−1)) disposed in a column direction (a vertical direction in FIG. 7) spaced apart from each other, respectively.

Each of the first to $(M \times N)^{th}$ nonvolatile memory cells 110-11, . . . , 110-1N, . . . , 110-M1, . . . , and 110-MN may have the same configuration as the nonvolatile memory cell 110 described with reference to FIG. 1. That is, each of the first to $(M \times N)^{th}$ nonvolatile memory cells 110-11, . . . , 110-1N, . . . , 110-M1, . . . , and 110-MN may include the first cell transistor 111, the second cell transistor 112 and the selection transistor 113. The first cell transistor 111, the second cell transistor 112 and the selection transistor 113 may be comprised of the first PMOS transistor PM1, the second PMOS transistor PM2 and the third PMOS transistor PM3, respectively. The source terminal of the selection transistor 113 of each of the first to $(M \times N)^{th}$ nonvolatile memory cells 110-11, . . . , 110-1N, . . . , 110-M1, . . . , and 110-MN may be coupled to any corresponding bit line of the bit lines BL-0, . . . and BL-(N−1), and the drain terminal of the selection transistor 113 may be coupled to both of the source terminals of the first and second cell transistors 111 and 112. The drain terminal of the first cell transistor 111 may be coupled to the drain terminal of the first switching transistor 121. The drain terminal of the second cell transistor 112 may be coupled to the drain terminal of the second switching transistor 122.

The nonvolatile memory cells arrayed in the same row may share the same selection gate line with each other. For example, the nonvolatile memory cells 110-11, . . . and 110-1N arrayed in the first row may share the first selection gate line SG-0 with each other. The first selection gate line SG-0 may correspond to a gate line acting as the gate terminal of the selection transistor 113 included in each of the nonvolatile memory cells 110-11, . . . and 110-1N arrayed in the first row. Similarly, the nonvolatile memory cells 110-11, . . . and 110-1N arrayed in the $M^{th}$ row may share the $M^{th}$ selection gate line SG-(M−1) with each other. The $M^{th}$ selection gate line SG-(M−1) may correspond to a gate line acting as the gate terminal of the selection transistor 113 included in each of the nonvolatile memory cells 110-M1, . . . and 110-MN arrayed in the $M^{th}$ row. The nonvolatile memory cells arrayed in the same column may share the same bit line with each other. For example, the nonvolatile memory cells 110-11, . . . and 110-M1 arrayed in the first column may share the first bit line BL-0 with each other. The first bit line BL-0 may correspond to a source line acting as the source terminal of the selection transistor 113 included in each of the nonvolatile memory cells 110-11, . . . and 110-M1 arrayed in the first column. Similarly, the nonvolatile memory cells 110-1N, . . . and 110-MN arrayed in the $N^{th}$ column may share the $N^{th}$ bit line BL-(N-1) with each other. The $N^{th}$ bit line BL-(N-1) may correspond to a source line acting as the source terminal of the selection transistor 113 included in each of the nonvolatile memory cells 110-1N, . . . and 110-MN arrayed in the $N^{th}$ column.

The cell transistor selector 120 may include the first and second switching transistors 121 and 122 as mentioned above. In addition, the first switching transistor 121 may be comprised of the first NMOS transistor NM1, and the second switching transistor 122 may be comprised of the second NMOS transistor NM2. The drain terminal of the first switching transistor 121 may be coupled to all of the drain terminals of the first cell transistors 111 included in the nonvolatile memory cells 110-11, . . . , 110-1N, . . . , 110-M1, . . . , and 110-MN. The source terminal of the first switching transistor 121 may be coupled to the ground voltage terminal. The drain terminal of the second switching transistor 122 may be coupled to all of the drain terminals of the second cell transistors 112 included in the nonvolatile memory cells 110-11, . . . , 110-1N, . . . , 110-M1, . . . , and 110-MN. The source terminal of the second switching transistor 122 may be coupled to the ground voltage terminal. When the first switching transistor 121 is turned on, all of the drain terminals of the first cell transistors 111 included in the nonvolatile memory cells 110-11, . . . , 110-1N, . . . , 110-M1, . . . , and 110-MN may be grounded. When the second switching transistor 122 is turned on, all of the drain terminals of the second cell transistors 112 included in the nonvolatile memory cells 110-11, . . . , 110-1N, . . . , 110-M1, . . . , and 110-MN may be grounded.

Any one of the nonvolatile memory cells 110-11, . . . , 110-1N, . . . , 110-M1, . . . , and 110-MN may be selected by a bit line voltage and a selection gate voltage to selectively perform the program operation or the read operation. To perform the program operation of the selected nonvolatile memory cell, a bit line program voltage may be applied to the bit line coupled to the selected nonvolatile memory cell and the remaining bit lines may be grounded. In addition, to perform the program operation of the selected nonvolatile memory cell, a program gate voltage having a low level may be applied to the selection gate line coupled to the selected nonvolatile memory cell and a gate voltage having a high level may be applied to the remaining selection gate lines. Similarly, to perform the read operation of the selected nonvolatile memory cell, a bit line read voltage may be applied to the bit line coupled to the selected nonvolatile memory cell and the remaining bit lines may be grounded. In addition, to perform the read operation of the selected nonvolatile memory cell, a read gate voltage having a low level may be applied to the selection gate line coupled to the selected nonvolatile memory cell and a gate voltage having a high level may be applied to the remaining selection gate lines. The program operation and the read operation of the selected nonvolatile memory cell may be performed the same way as a program operation and a read operation of the nonvolatile memory cell 110 shown in FIG. 1, which will be described hereinafter.

Figure 8:
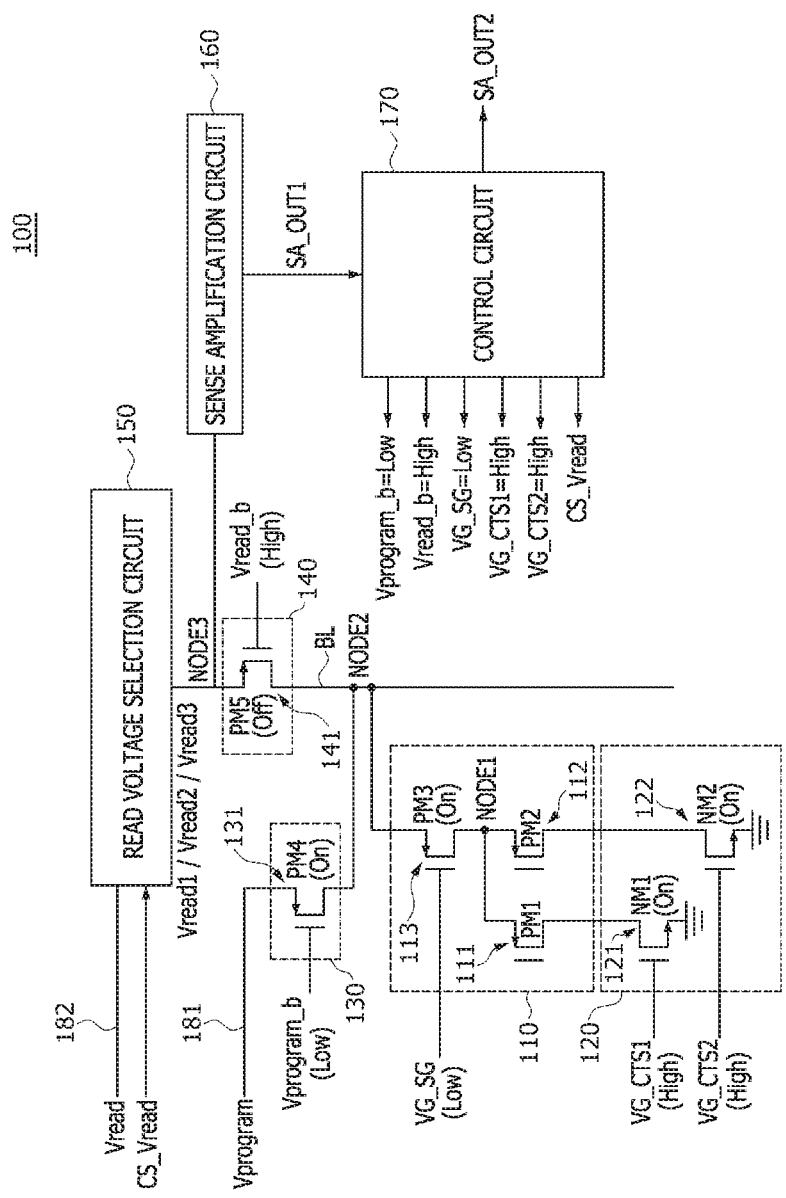
FIG. 8 illustrates a program operation of a nonvolatile memory device according to various embodiments of the present disclosure.

FIG. 8 is a schematic view illustrating the program operation of the nonvolatile memory device 100 shown in FIG. 1. In FIG. 8, the same reference numerals and symbols as used in FIG. 1 represent the same elements. Referring to FIG. 8, the program operation of the nonvolatile memory cell 110 according to an embodiment may be performed such that the first and second cell transistors 111 and 112 included in the nonvolatile memory cell 110 are simultaneously programmed. In order to program the first and second cell transistors 111 and 112 included in the nonvolatile memory cell 110, the control circuit 170 may generate the program gate voltage Vprogram_b having a low level, the read gate voltage Vread_b having a high level, the selection gate voltage VG_SG having a low level, the first switching gate voltage VG_CTS1 having a high level, and the second switching gate voltage VG_CTS2 having a high level. Thus, while the program switching transistor 131 is turned on, the read switching transistor 141 may be turned off. In addition, the selection transistor 113 of the nonvolatile memory cell 110 and the first and second switching transistors 121 and 122 of the cell transistor selector 120 may be turned on.

Because the program voltage Vprogram and the ground voltage are applied to respective terminals of the source terminal and the drain terminal of the first cell transistor 111 under the above bias condition, hot carriers may be generated in the first cell transistor 111 and the hot carriers (i.e., hot electrons) may be injected into the floating gate of the first cell transistor 111. Accordingly, the first cell transistor 111 may have the programmed status that a channel acting as a current path is formed between the drain terminal and the source terminal of the first cell transistor 111 to turn on the first cell transistor 111. Similarly, because the program voltage Vprogram and the ground voltage are applied to respective terminals of the source terminal and the drain terminal of the second cell transistor 112 under the above bias condition, hot carriers may also be generated in the second cell transistor 112 and the hot carriers (i.e., hot electrons) may be injected into the floating gate of the second cell transistor 112. Accordingly, the second cell transistor 112 may also have the programmed status that a channel acting as a current path is formed between the drain terminal and the source terminal of the second cell transistor 112 to turn on the second cell transistor 112.

As described above, the first and second cell transistors 111 and 112 included in the nonvolatile memory cell 110 may be simultaneously programmed by the program operation of the nonvolatile memory device 100. Moreover, because the current drivability of the first cell transistor 111 is different from the current drivability of the second cell transistor 112, an amount of a first cell current flowing through the first cell transistor 111 may be different from an amount of a second cell current flowing through the second cell transistor 112 during the read operation. However, after the program operation of the nonvolatile memory cell 110 is performed, both of the first and second cell transistors 111 and 112 may have a large current drivability such that a cell current flowing through each of the first and second cell transistors 111 and 112 is greater than a cell current corresponding to the third read voltage Vread3. Thus, the program verifying operation may be performed using the third read voltage Vread3 to verify the programmed status of the nonvolatile memory cell 110, as described with reference to FIG. 1. The program verifying operation may be achieved by sequentially performing the read operations of the first and second cell transistors 111 and 112 with the third read voltage Vread3.

Figure 9:
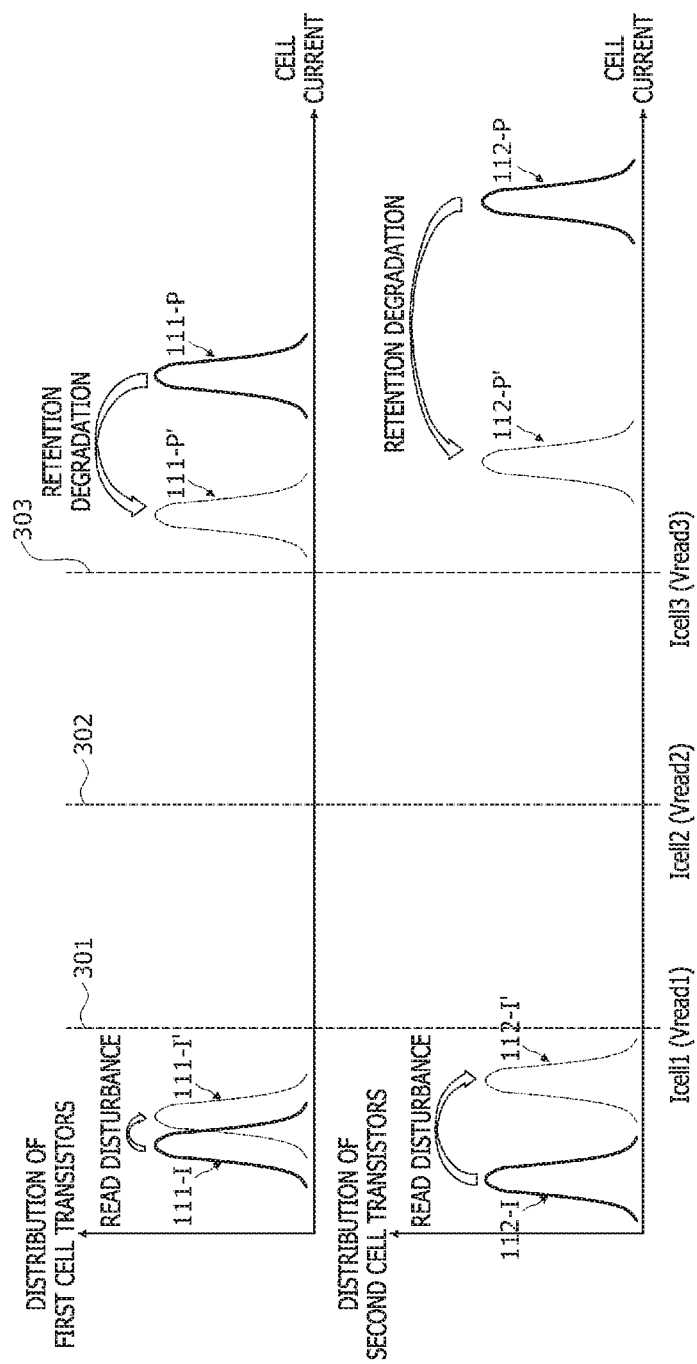
FIG. 9 is a merged graph illustrating distribution of first and second cell transistors versus a cell current to show cell current variation of the first and second cell transistors according to read disturbance and retention degradation, according to various embodiments of the present disclosure.

FIG. 9 is a merged graph illustrating distribution of the first and second cell transistors 111 and 112 versus a cell current and illustrating cell current variation of the first and second cell transistors 111 and 112 according to the read disturbance and the retention degradation, in the nonvolatile memory device 100 according to various embodiments of the present disclosure. In FIG. 9, the abscissas denote a cell current. Moreover, the ordinate in an upper graph of FIG. 9 denotes the distribution of the first cell transistors 111, and the ordinate in a lower graph of FIG. 9 denotes the distribution of the second cell transistors 112. In FIG. 9, a first dotted line 301 extending in a vertical direction represents a first cell current Icell1 corresponding to the first read voltage Vread1, a second dotted line 302 extending in the vertical direction represents a second cell current Icell2 corresponding to the second read voltage Vread2, and a third dotted line 303 extending in the vertical direction represents a third cell current Icell3 corresponding to the third read voltage Vread3.

Referring to FIG. 9, as indicated by reference numeral 111_I, the first cell transistor 111 having the initialized status may exhibit a cell current which is less than the first cell current Icell1. Similarly, as indicated by reference numeral 112_I, the second cell transistor 112 having the initialized status may also exhibit a cell current which is less than the first cell current Icell1. Furthermore, as indicated by reference numeral 111_I', a cell current of the first cell transistor 111 having the initialized status may increase due to the read disturbance phenomenon. Similarly, as indicated by reference numeral 112_I', a cell current of the second cell transistor 112 having the initialized status may also increase due to the read disturbance phenomenon. In such a case, because the current drivability of the second cell transistor 112 is greater than the current drivability of the first cell transistor 111, an increment of the cell current of the second cell transistor 112 may be greater than an increment of the cell current of the first cell transistor 111 when the read disturbance phenomenon occurs. Thus, when both of the first and second cell transistors 111 and 112 are degraded due to the read disturbance phenomenon, it may be highly possible that the cell current of the second cell transistor 112 increases to be greater than the first cell current Icell1, rather than that the cell current of the first cell transistor 111 increases to be greater than the first cell current Icell1.

As indicated by reference numeral 111_P, the first cell transistor 111 having the programmed status may exhibit a cell current which is greater than the third cell current Icell3. Similarly, as indicated by reference numeral 112_P, the second cell transistor 112 having the programmed status may also exhibit a cell current which is greater than the third cell current Icell3. Furthermore, as indicated by reference numeral 111_P', a cell current of the first cell transistor 111 having the programmed status may be reduced due to the retention degradation (i.e., degradation of the data retention characteristic). Similarly, as indicated by reference numeral 112_P', a cell current of the second cell transistor 112 having the programmed status may also be reduced due to the retention degradation. In such a case, because the current drivability of the second cell transistor 112 is greater than the current drivability of the first cell transistor 111, a decrement of the cell current of the second cell transistor 112 may be greater than a decrement of the cell current of the first cell transistor 111 when the retention degradation occurs. Thus, when both of the first and second cell transistors 111 and 112 are degraded due to the retention degradation, it may be highly possible that the cell current of the second cell transistor 112 is reduced to be less than the third cell current Icell3, rather than that the cell current of the first cell transistor 111 is reduced to be less than the third cell current Icell3.

Figure 10:
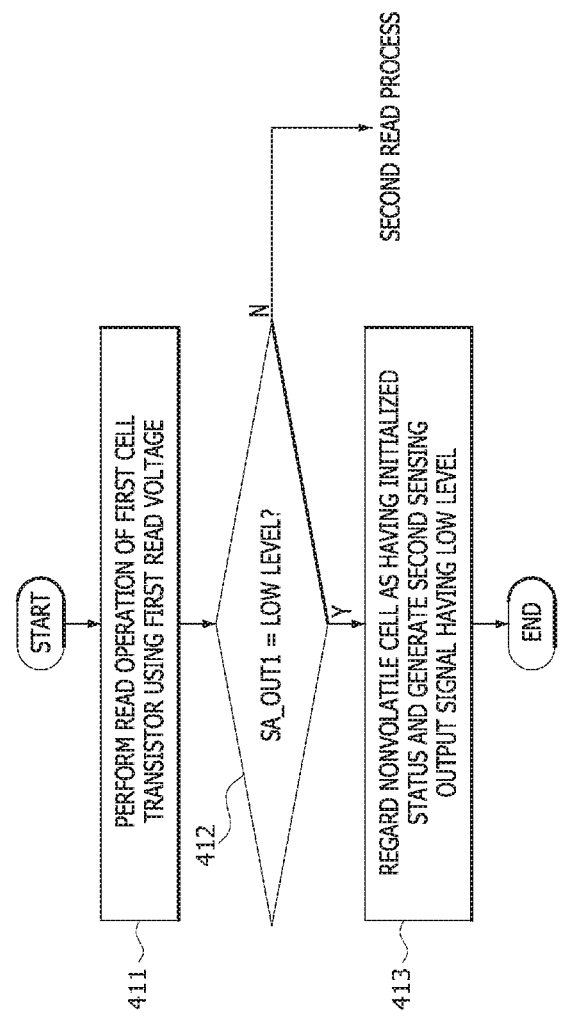
FIGS. 10, 11 and 12 are flowcharts illustrating a read operation of a nonvolatile memory device according to various embodiments of the present disclosure.
Figure 11:
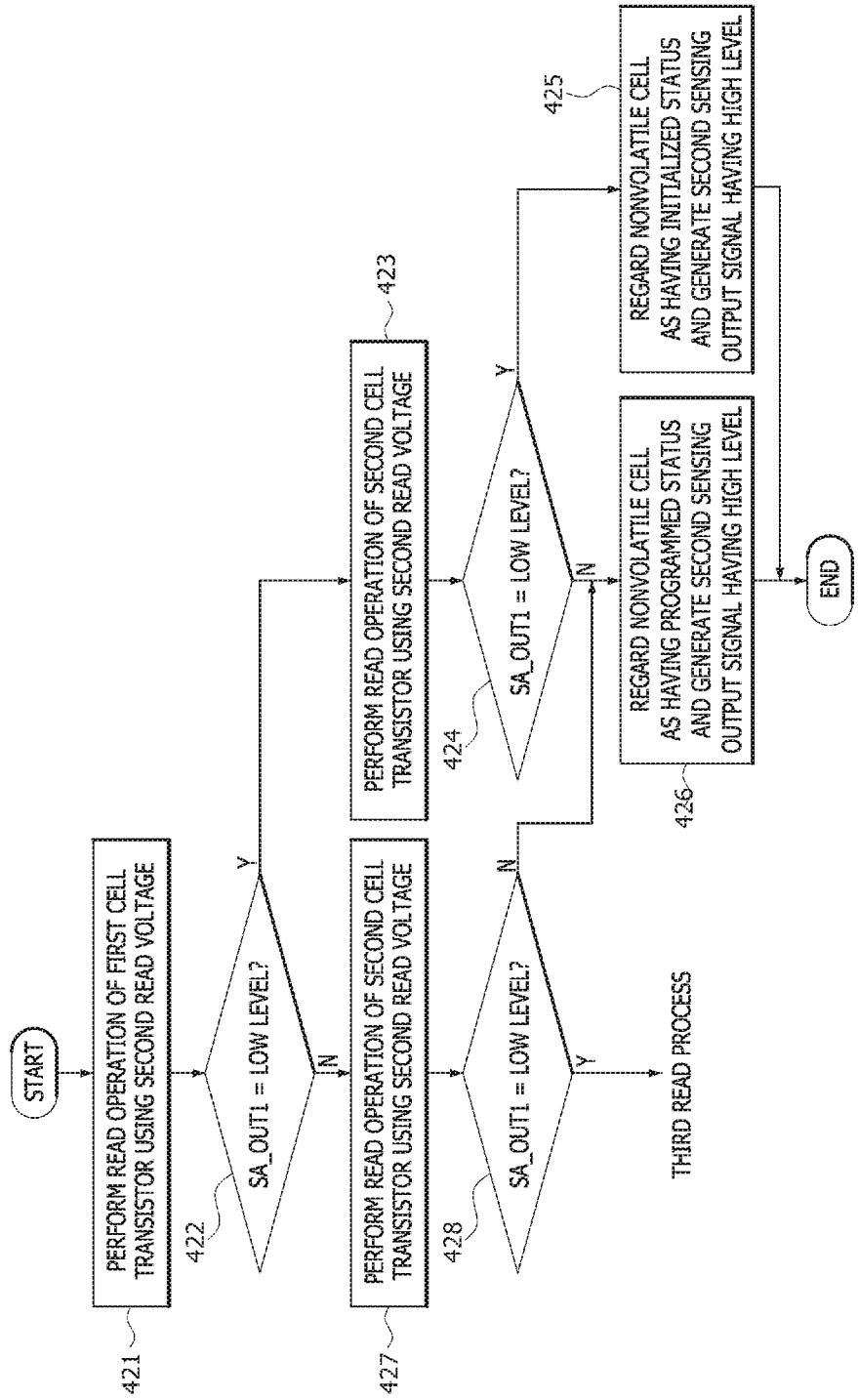
Figure 12:
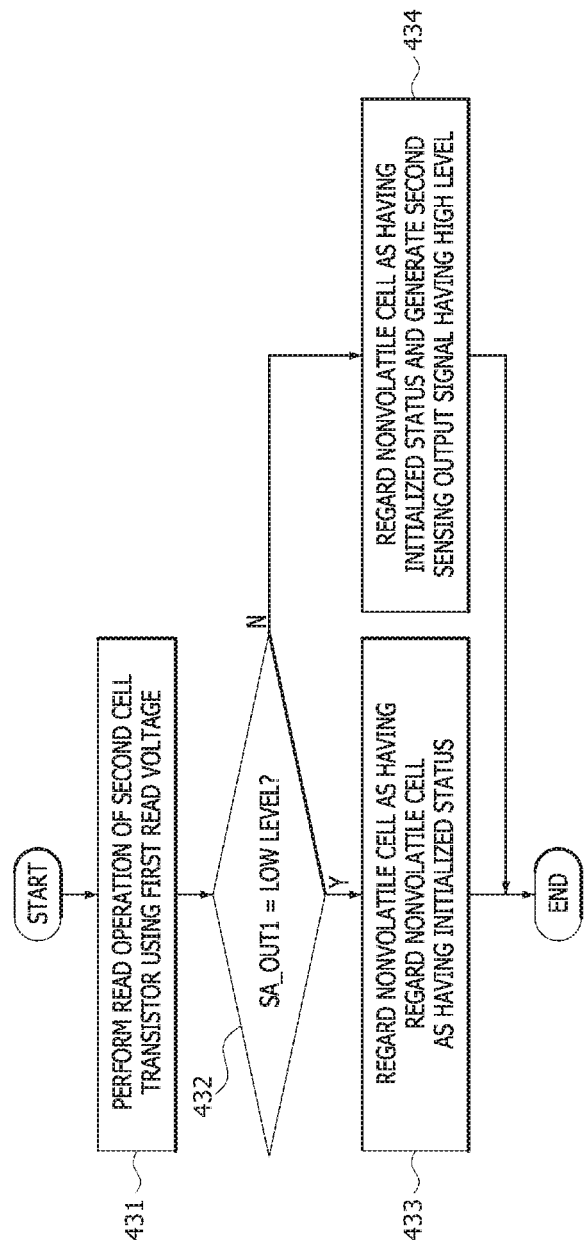

FIGS. 10, 11 and 12 are flowcharts illustrating the read operation of the nonvolatile memory device 100 according to various embodiments of the present disclosure. In addition, FIGS. 13 to 19 more specifically illustrate steps of the flowcharts of FIGS. 10, 11 and 12. In FIGS. 13 to 19, the same reference numerals and symbols as used in FIG. 1 denote the same elements. According to the read operation described in the present embodiment, after the read operation of the first cell transistor 111 included in the nonvolatile memory cell 110 is performed, the read operation of the second cell transistor 112 may be additionally performed when a status of the nonvolatile memory cell 110 is suspected to be unclear. Thus, the frequency of the read operations for the second cell transistor 112 may be less than the frequency of the read operations for the first cell transistor 111. This means that the second cell transistor 112 may be less affected by the read disturbance phenomenon depending on the frequency of the read operations, as compared with the first cell transistor 111. Accordingly, when the read disturbance status of the first cell transistor 111 is suspected as a result of the read operation of the first cell transistor 111, the result of the read operation for the first cell transistor 111 may be reserved without any decision and the read disturbance status of the first cell transistor 111 may be analogized through the read operation of the second cell transistor 112.

First, referring to FIG. 10, the read operation of the first cell transistor 111 having a relatively small current drivability may be performed using the first read voltage Vread1 having a relatively low level at a step 411. At a step 412, it may be determined whether the first sensing output signal SA_OUT1 has a low level. If the first sensing output signal SA_OUT1 has a low level at the step 412, the nonvolatile memory cell 110 may be regarded as having the initialized status and the control circuit 170 may output a low level signal as the second sensing output signal SA_OUT2 at a step 413. In contrast, if the first sensing output signal SA_OUT1 has a high level at the step 412, a second read process illustrated in FIG. 11 may be performed.

Figure 13:
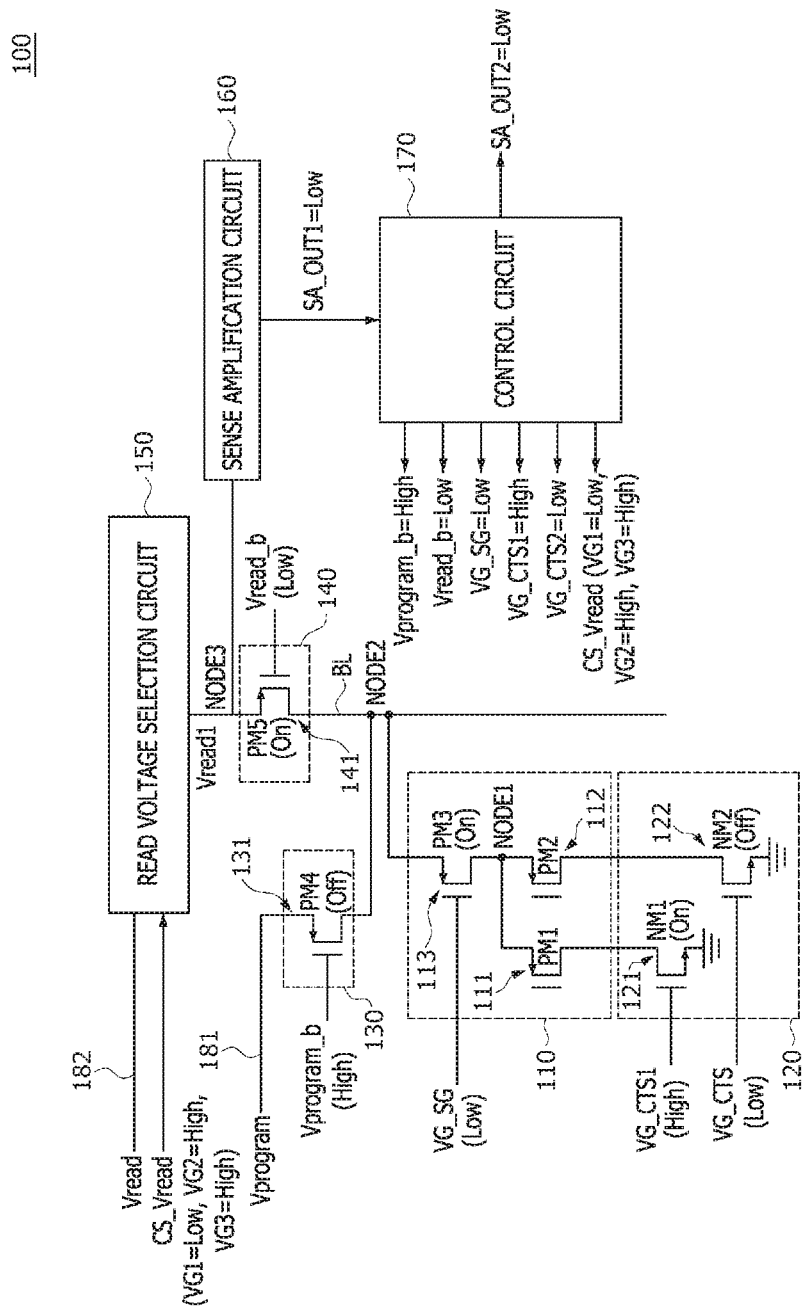
FIGS. 13 to 19 more specifically illustrate steps of the flowcharts of FIGS. 10, 11 and 12.
Figure 14:
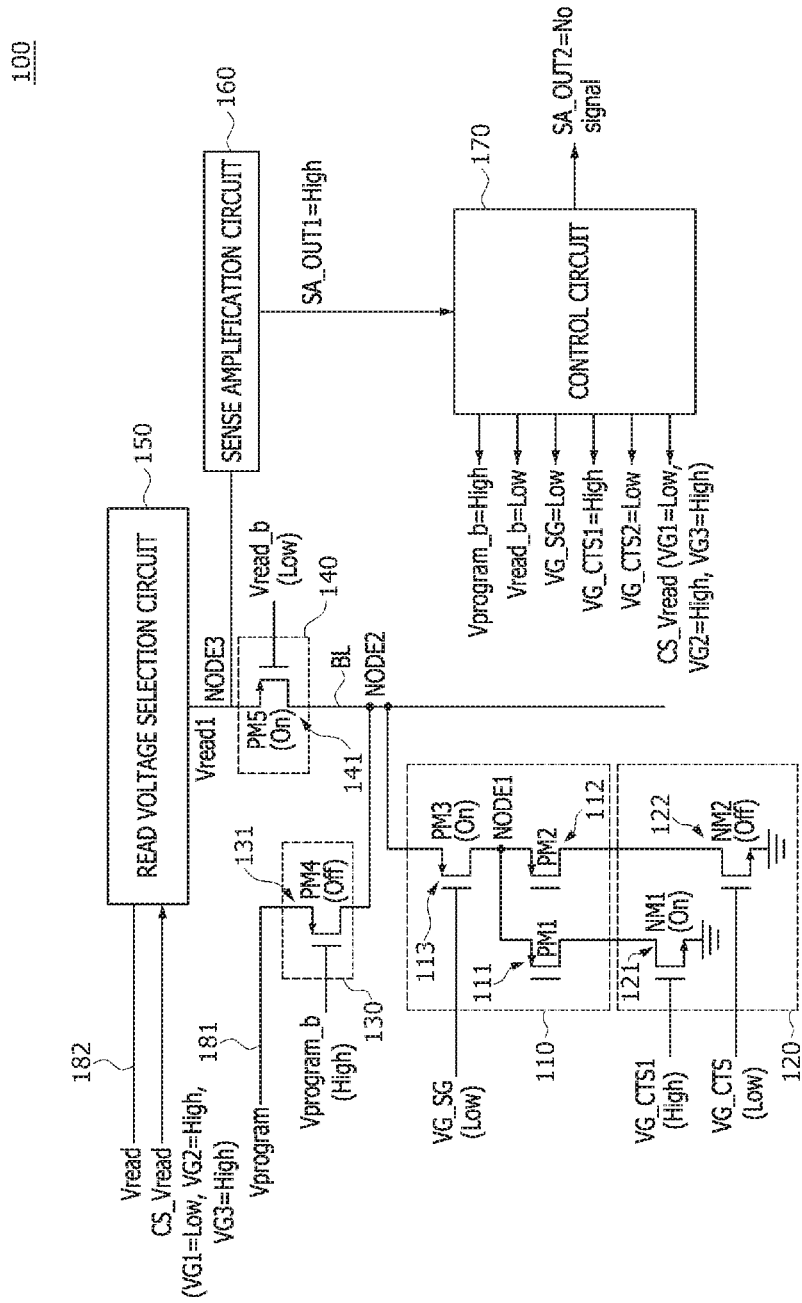

The steps 411, 412 and 413 will be described in detail hereinafter with reference to FIGS. 13 and 14. As illustrated in FIGS. 13 and 14, the control circuit 170 may generate the program gate voltage Vprogram_b having a high level, the read gate voltage Vread_b having a low level, the selection gate voltage VG_SG having a low level, the first switching gate voltage VG_CTS1 having a high level, and the second switching gate voltage VG_CTS2 having a low level to perform the read operation of the nonvolatile memory cell 110 at the step 411 of FIG. 10. In addition, the control circuit 170 may generate and output the first gate voltage VG1 having a low level, the second gate voltage VG2 having a high level, and the third gate voltage VG3 having a high level to the read voltage selection circuit 150. Thus, while the read switching transistor 141 is turned on, the program switching transistor 131 may be turned off. In addition, while both of the selection transistor 113 of the nonvolatile memory cell 110 and the first switching transistor 121 of the cell transistor selector 120 are turned on, the second switching transistor 122 of the cell transistor selector 120 may be turned off.

The read voltage selection circuit 150 may receive the first gate voltage VG1 having a low level, the second gate voltage VG2 having a high level, and the third gate voltage VG3 having a high level to generate and output the first read voltage Vread1 through the third node NODE3 of the bit line BL, as described with reference to FIGS. 3 and 4. Because the read switching transistor 141 and the selection transistor 113 are turned on, the first read voltage Vread1 may be applied to the first node NODE1 of the nonvolatile memory cell 110. As the first switching transistor 121 is turned on, the first read voltage Vread1 may be applied between the source terminal and the drain terminal of the first cell transistor 111. In contrast, as the second switching transistor 122 is turned off, an open circuit may be provided between the drain terminal of the second cell transistor 112 and the ground voltage terminal.

The third node NODE3 of the bit line BL may maintain the first read voltage Vread1 or may be grounded according to whether the first cell transistor 111 is turned off or on by the first read voltage Vread1 applied between the source terminal and the drain terminal of the first cell transistor 111. When the first cell transistor 111 is turned off, the third node NODE3 of the bit line BL may maintain the first read voltage Vread1. When the third node NODE3 of the bit line BL maintains the first read voltage Vread1, the sense amplification circuit 160 may output the first sensing output signal SA_OUT1 having a low level, as illustrated in FIG. 13. In contrast, when the first cell transistor 111 is turned on, the third node NODE3 of the bit line BL may be grounded. When the third node NODE3 of the bit line BL is grounded, the sense amplification circuit 160 may output the first sensing output signal SA_OUT1 having a high level, as illustrated in FIG. 14. The first sensing output signal SA_OUT1 outputted from the sense amplification circuit 160 may be inputted to the control circuit 170.

When the first sensing output signal SA_OUT1 has a low level as illustrated in FIG. 13, the first cell transistor 111 may exhibit a cell current which is less than the first cell current Icell1 corresponding to the first read voltage Vread1, as described with reference to FIG. 9. This means that the first cell transistor 111 is turned off to have the initialized status when the first read voltage Vread1 is applied to the first cell transistor 111. Because a variation of a cell current of the first cell transistor 111 due to the retention degradation is relatively small, there may be little possibility that a cell current (which is greater than the third cell current Icell3) of the first cell transistor 111 having the programmed status is reduced to be less than the first cell current Icell1 due to the retention degradation. Thus, the control circuit 170 may regard the nonvolatile memory cell 110 as having the initialized status without execution of an additional read operation of the second cell transistor 112. Thus, the control circuit 170 may generate the second sensing output signal SA_OUT2 having a low level as a result of a final read operation of the nonvolatile memory cell 110, as described with reference to the step 413 of FIG. 10.

In contrast, when the first sensing output signal SA_OUT1 has a high level as illustrated in FIG. 14, the first cell transistor 111 may exhibit a cell current which is greater than the first cell current Icell1 corresponding to the first read voltage Vread1, as described with reference to FIG. 9. This means that the first cell transistor 111 is turned on to have the programmed status when the first read voltage Vread1 is applied to the first cell transistor 111. However, it may be unreasonable to conclude that the nonvolatile memory cell 110 has the programmed status based only on the fact that the first cell transistor 111 is turned on at the first read voltage Vread1. The reason is because the first cell transistor 111 having the initialized status (i.e., turned-off status) may exhibit a cell current which is greater than the first cell current Icell1 due to the read disturbance. Thus, even though the first sensing output signal SA_OUT1 has a high level at the step 412, it may be necessary to verify whether the cell current of the nonvolatile memory cell 110 is due to the normally programmed status or the read disturbance. In order to verify the status of the nonvolatile memory cell 110, the control circuit 170 may generate signals for the second read process instead of the second sensing output signal SA_OUT2.

Referring to FIG. 11 illustrating the second read process, when a level of the first sensing output signal SA_OUT1 is not a low level (i.e., the first sensing output signal SA_OUT1 has a high level) at the step 412 of FIG. 10, the read operation of the first cell transistor 111 may be performed using the second read voltage Vread2 higher than the first read voltage Vread1 at a step 421. At a step 422, it may be determined whether the first sensing output signal SA_OUT1 has a low level. If the first sensing output signal SA_OUT1 has a low level at the step 422, the read operation of the second cell transistor 112 having a relatively large current drivability may be performed using the second read voltage Vread2 at a step 423. At a step 424, it may be determined whether the first sensing output signal SA_OUT1 has a low level. When the first sensing output signal SA_OUT1 has a low level at the step 424, the nonvolatile memory cell 110 may be determined to have the initialized status and the control circuit 170 may output a low level signal as the second sensing output signal SA_OUT2 at a step 425. In contrast, when the first sensing output signal SA_OUT1 has a high level at the step 424, the nonvolatile memory cell 110 may be determined to have the programmed status and the control circuit 170 may output a high level signal as the second sensing output signal SA_OUT2 at a step 426.

When the first sensing output signal SA_OUT1 has a high level at the step 422, the read operation of the second cell transistor 112 may be performed using the second read voltage Vread2 at a step 427. At a step 428, it may be determined whether the first sensing output signal SA_OUT1 has a low level. When a level of the first sensing output signal SA_OUT1 is not a low level (i.e., the first sensing output signal SA_OUT1 has a high level) at the step 428, the nonvolatile memory cell 110 may be determined to have the programmed status and the control circuit 170 may output a high level signal as the second sensing output signal SA_OUT2 at the step 426. In contrast, if the first sensing output signal SA_OUT1 has a low level at the step 428, a third read process may be performed, as illustrated in FIG. 12.

Figure 15:
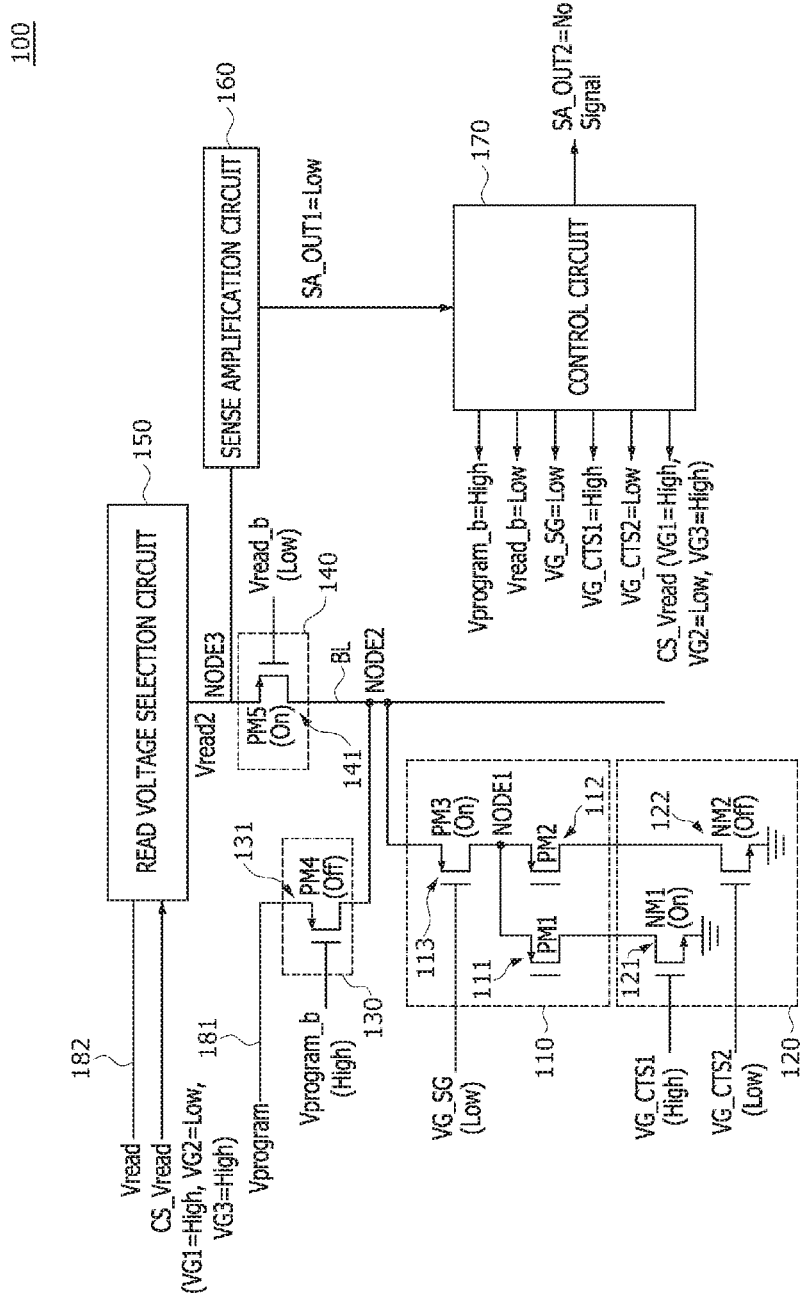

As illustrated in FIG. 15, the control circuit 170 may generate the program gate voltage Vprogram_b having a high level, the read gate voltage Vread_b having a low level, the selection gate voltage VG_SG having a low level, the first switching gate voltage VG_CTS1 having a high level, and the second switching gate voltage VG_CTS2 having a low level to perform the step 421 of FIG. 11. In addition, the control circuit 170 may generate and output the first gate voltage VG1 having a high level, the second gate voltage VG2 having a low level, and the third gate voltage VG3 having a high level to the read voltage selection circuit 150. Thus, while the read switching transistor 141 is turned on, the program switching transistor 131 may be turned off. In addition, while both of the selection transistor 113 of the nonvolatile memory cell 110 and the first switching transistor 121 of the cell transistor selector 120 are turned on, the second switching transistor 122 of the cell transistor selector 120 may be turned off.

The read voltage selection circuit 150 may receive the first gate voltage VG1 having a high level, the second gate voltage VG2 having a low level, and the third gate voltage VG3 having a high level to generate and output the second read voltage Vread2 through the third node NODE3 of the bit line BL, as described with reference to FIG. 5. As described with reference to FIG. 1, the second read voltage Vread2 may be higher than the first read voltage Vread2. As both of the read switching transistor 141 and the selection transistor 113 are turned on, the second read voltage Vread2 may be applied to the first node NODE1 of the nonvolatile memory cell 110. As the first switching transistor 121 is turned on, the second read voltage Vread2 may be applied between the source terminal and the drain terminal of the first cell transistor 111. In contrast, as the second switching transistor 122 is turned off, an open circuit may be provided between the drain terminal of the second cell transistor 112 and the ground voltage terminal.

Although the first cell transistor 111 is regarded as being turned on (i.e., the programmed status) during the read process performed using the first read voltage Vread1 (see the step 411 of FIG. 10), it may be unclear whether the first cell transistor 111 is a cell transistor which normally has the programmed status or which originally has the initialized status but exhibits an increased cell current due to the read disturbance. Thus, in the following process, it may be necessary to additionally perform the read operation of the first cell transistor 111 using the second read voltage Vread2 which is higher than the first read voltage Vread1. If the first sensing output signal SA_OUT1 having a low level is generated as a result of the read operation performed using the second read voltage Vread2, it may indicate that the first cell transistor 111 is turned off when the second read voltage Vread2 is applied to the first cell transistor 111. This means that the first cell transistor 111 exhibits a cell current which is within a range between the first cell current Icell1 corresponding to the first read voltage Vread1 and the second cell current Icell2 corresponding to the second read voltage Vread2. In such a case, it may be highly possible that a cell current of the first cell transistor 111 originally having the initialized status increases due to the read disturbance, rather than that a cell current of the first cell transistor 111 originally having the programmed status is reduced due to the retention degradation. In order to verify whether the cell current of the first cell transistor 111 originally having the initialized status increases due to the read disturbance or the cell current of the first cell transistor 111 originally having the programmed status is reduced due to the retention degradation, the second sensing output signal SA_OUT2 is not generated by the control circuit 170 and the read operation of the second cell transistor 112 may be performed using the second read voltage Vread2 (see the step 423 of FIG. 11).

Figure 16:
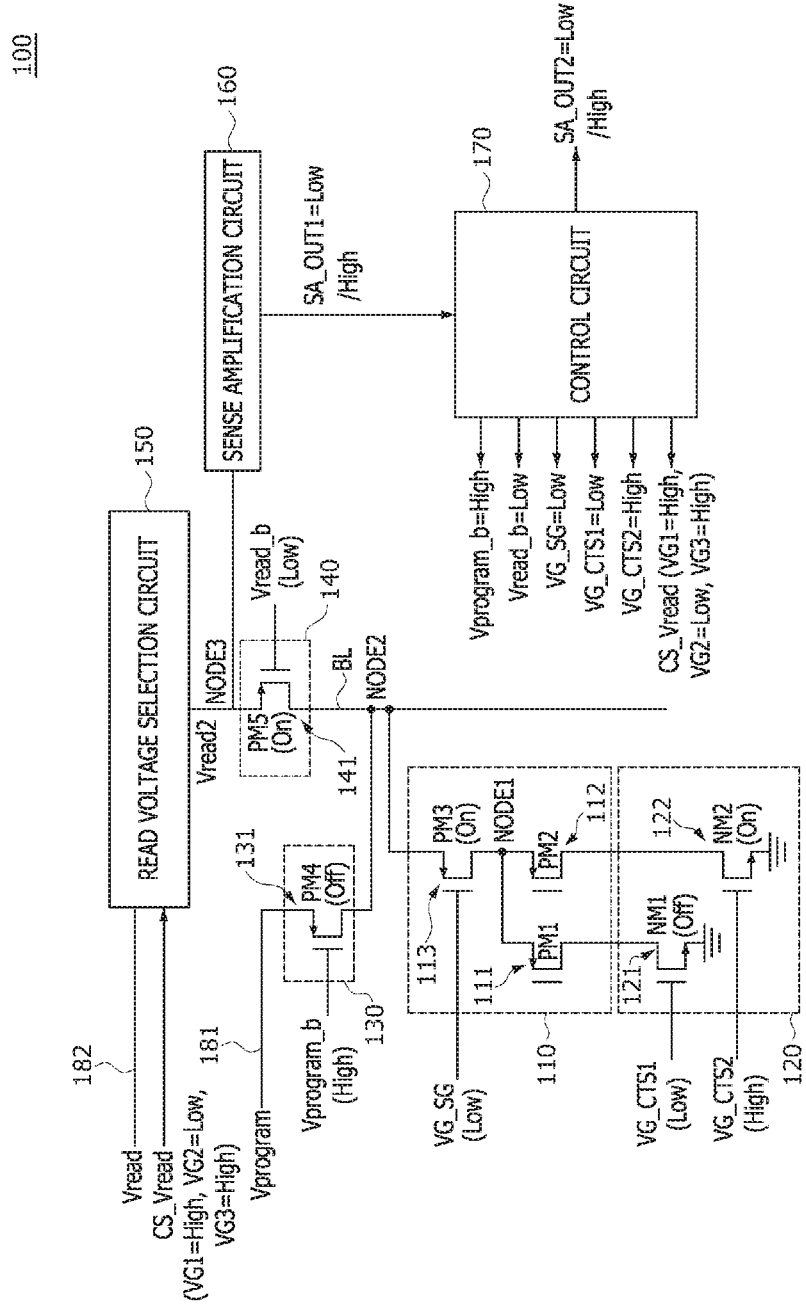

As illustrated in FIG. 16, the control circuit 170 may generate the program gate voltage Vprogram_b having a high level, the read gate voltage Vread_b having a low level, the selection gate voltage VG_SG having a low level, the first switching gate voltage VG_CTS1 having a low level, and the second switching gate voltage VG_CTS2 having a high level to perform the step 423 of FIG. 11. In addition, the control circuit 170 may generate and output the first gate voltage VG1 having a high level, the second gate voltage VG2 having a low level, and the third gate voltage VG3 having a high level to the read voltage selection circuit 150. Thus, while the read switching transistor 141 is turned on, the program switching transistor 131 may be turned off. In addition, while both of the selection transistor 113 of the nonvolatile memory cell 110 and the second switching transistor 122 of the cell transistor selector 120 are turned on, the first switching transistor 121 of the cell transistor selector 120 may be turned off.

The read voltage selection circuit 150 may receive the first gate voltage VG1 having a high level, the second gate voltage VG2 having a low level, and the third gate voltage VG3 having a high level to generate and output the second read voltage Vread2 through the third node NODE3 of the bit line BL, as described with reference to FIGS. 3 and 5. As both of the read switching transistor 141 and the selection transistor 113 are turned on, the second read voltage Vread2 may be applied to the first node NODE1 of the nonvolatile memory cell 110. As the second switching transistor 122 is turned on, the second read voltage Vread2 may be applied between the source terminal and the drain terminal of the second cell transistor 112. In contrast, as the first switching transistor 121 is turned off, an open circuit may be provided between the drain terminal of the first cell transistor 111 and the ground voltage terminal.

As a result of the read operation of the second cell transistor 112 performed using the second read voltage Vread2, the first sensing output signal SA_OUT1 may be generated to have a low level or a high level. If the first sensing output signal SA_OUT1 having a low level is generated as a result of the read operation of the second cell transistor 112 performed using the second read voltage Vread2, it may indicate that the second cell transistor 112 exhibits a cell current which is less than the second cell current Icell2 corresponding to the second read voltage Vread2. It may be highly possible that a cell current of the first cell transistor 111 having the initialized status increases to be greater than the first cell current Icell1 due to the read disturbance, rather than that a cell current of the second cell transistor 112 having the programmed status is reduced to be less than the second cell current Icell2 due to the retention degradation. Thus, the control circuit 170 may finally regard the nonvolatile memory cell 110 as having the initialized status to output a low level signal as the second sensing output signal SA_OUT2. In addition, the first cell transistor 111 of the nonvolatile memory cell 110 may be regarded as having an increased cell current which is due to the read disturbance.

If the first sensing output signal SA_OUT1 having a high level is generated as a result of the read operation of the second cell transistor 112 performed using the second read voltage Vread2, it may indicate that the second cell transistor 112 exhibits a cell current which is greater than the second cell current Icell2 corresponding to the second read voltage Vread2. In such a case, it may be highly possible that a cell current of the second cell transistor 112 having the programmed status is reduced to be less than the second cell current Icell2 due to the retention degradation, rather than that a cell current of the first cell transistor 111 having the initialized status increases to be greater than the first cell current Icell1 due to the read disturbance. Thus, the control circuit 170 may finally determine the nonvolatile memory cell 110 to have the programmed status in order to output a high level signal as the second sensing output signal SA_OUT2. In addition, the first cell transistor 111 of the nonvolatile memory cell 110 may be determined to have an increased cell current which is due to the read disturbance.

Figure 17:
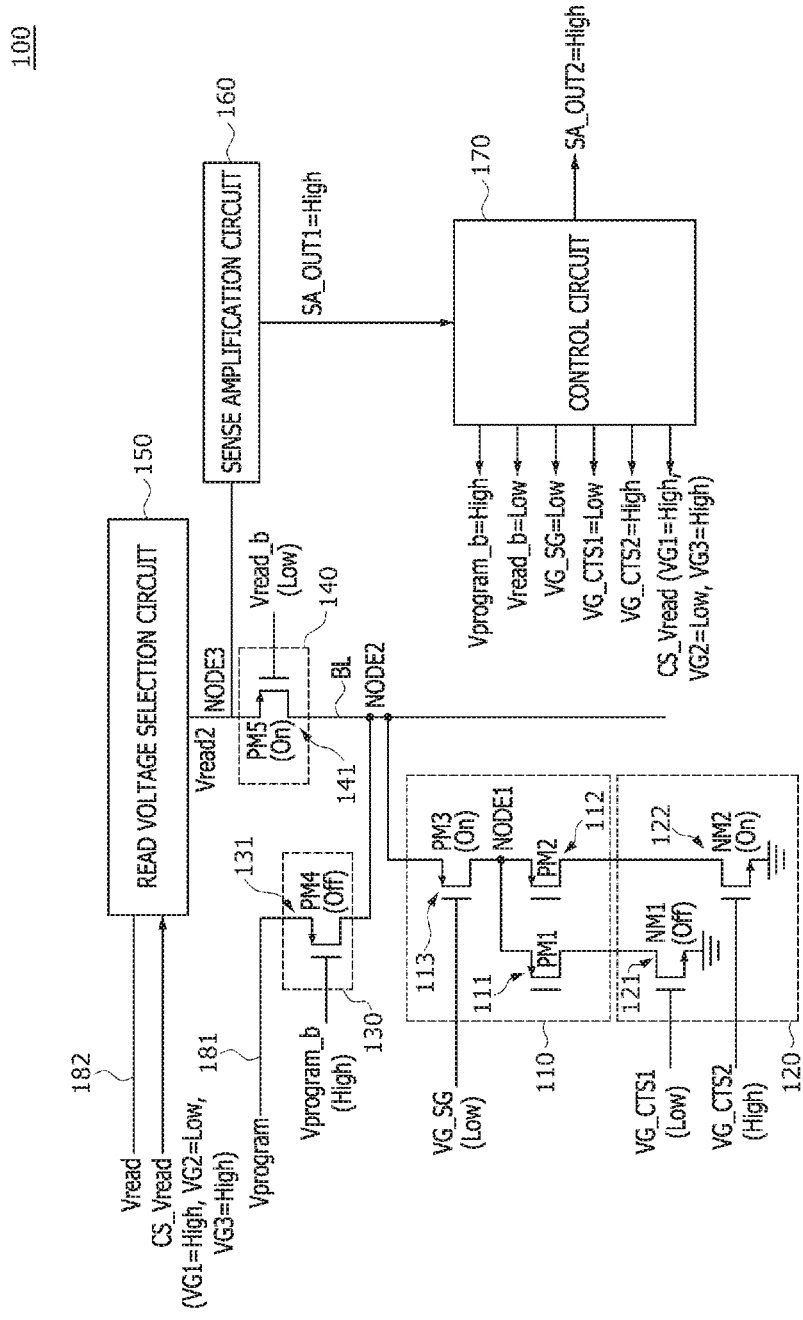
Figure 18:
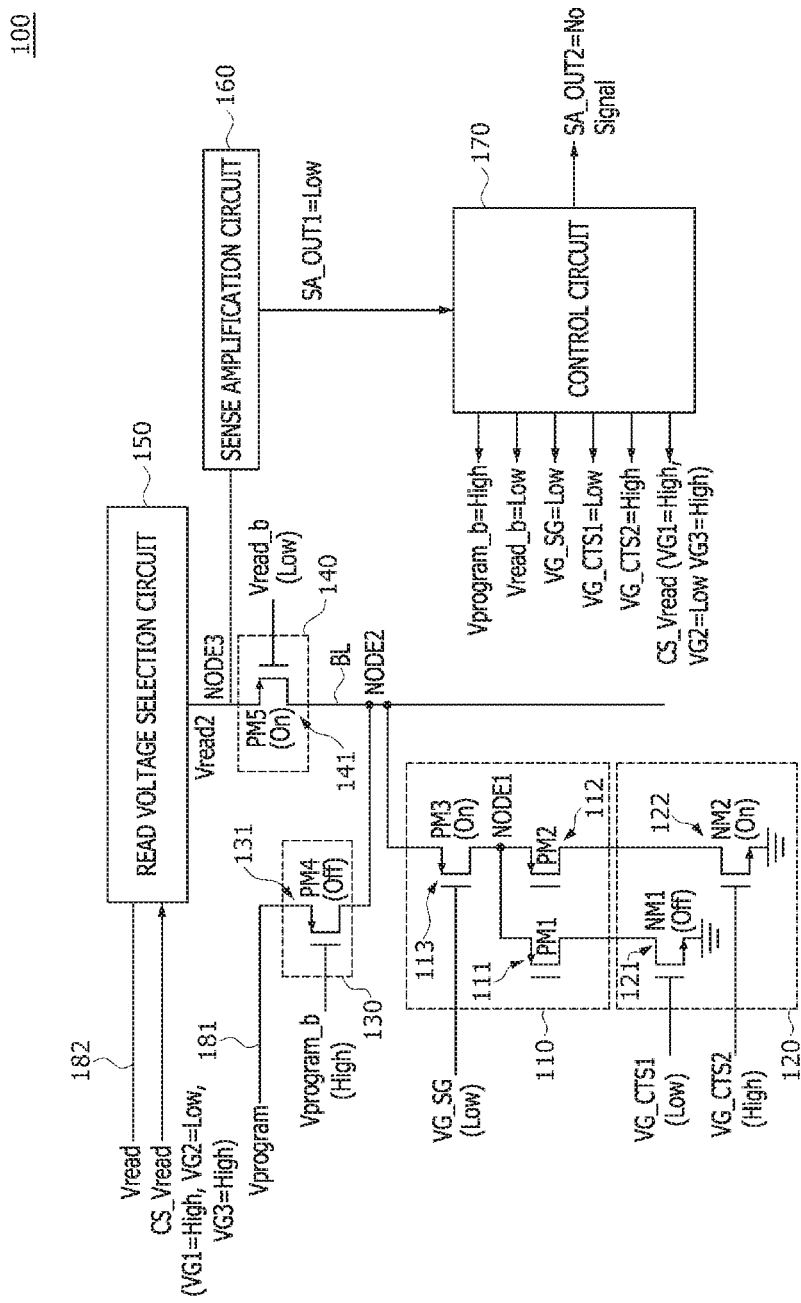

Moreover, if the first cell transistor 111 is turned on by the read operation of the first cell transistor 111 using the first read voltage Vread1 (see the step 411 of FIG. 10) and the first cell transistor 111 is turned on even by the read operation of the first cell transistor 111 using the second read voltage Vread2 (see the step 421 of FIG. 11), the step 427 of FIG. 11 may be executed. As illustrated in FIGS. 17 and 18, the control circuit 170 may generate the program gate voltage Vprogram_b having a high level, the read gate voltage Vread_b having a low level, the selection gate voltage VG_SG having a low level, the first switching gate voltage VG_CTS1 having a low level, and the second switching gate voltage VG_CTS2 having a high level to perform the step 427 of FIG. 11. In addition, the control circuit 170 may generate and output the first gate voltage VG1 having a high level, the second gate voltage VG2 having a low level, and the third gate voltage VG3 having a high level to the read voltage selection circuit 150. Thus, while the read switching transistor 141 is turned on, the program switching transistor 131 may be turned off. In addition, while both of the selection transistor 113 of the nonvolatile memory cell 110 and the second switching transistor 122 of the cell transistor selector 120 are turned on, the first switching transistor 121 of the cell transistor selector 120 may be turned off.

The read voltage selection circuit 150 may receive the first gate voltage VG1 having a high level, the second gate voltage VG2 having a low level, and the third gate voltage VG3 having a high level to generate and output the second read voltage Vread2 through the third node NODE3 of the bit line BL, as described with reference to FIGS. 3 and 5. As both of the read switching transistor 141 and the selection transistor 113 are turned on, the second read voltage Vread2 may be applied to the first node NODE1 of the nonvolatile memory cell 110. As the second switching transistor 122 is turned on, the second read voltage Vread2 may be applied between the source terminal and the drain terminal of the second cell transistor 112. In contrast, as the first switching transistor 121 is turned off, an open circuit may be provided between the drain terminal of the first cell transistor 111 and the ground voltage terminal.

As illustrated in FIG. 17, if the first sensing output signal SA_OUT1 having a high level is generated as a result of the read operation of the second cell transistor 112 performed using the second read voltage Vread2, it may indicate that the second cell transistor 112 exhibits a cell current which is greater than the second cell current Icell2 corresponding to the second read voltage Vread2. As a result, this may also indicate that both of a cell current of the first cell transistor 111 and a cell current of the second cell transistor 112 are greater than the second cell current Icell2 corresponding to the second read voltage Vread2. There may be little possibility that a cell current of the first cell transistor 111 having the initialized status increases to be greater than the second cell current Icell2 due to the read disturbance. In addition, there may be little possibility that a cell current of the second cell transistor 112 having the initialized status increases to be greater than the second cell current Icell2 due to the read disturbance. Thus, the control circuit 170 may finally determine the nonvolatile memory cell 110 to have the programmed status in order to output a high level signal as the second sensing output signal SA_OUT2, as described at the step 426 of FIG. 11. In such a case, both of the first and second cell transistors 111 and 112 may be regarded as being normally programmed.

In contrast, as illustrated in FIG. 18, if the first sensing output signal SA_OUT1 having a low level is generated as a result of the read operation of the second cell transistor 112 performed using the second read voltage Vread2, it may indicate that the second cell transistor 112 exhibits a cell current which is less than the second cell current Icell2 corresponding to the second read voltage Vread2. As a result, this may also indicate that a cell current of the first cell transistor 111 is greater than the second cell current Icell2 corresponding to the second read voltage Vread2 and a cell current of the second cell transistor 112 is less than the second cell current Icell2 corresponding to the second read voltage Vread2. That is, it may indicate that the first cell transistor 111 is turned on and the second cell transistor 112 is turned off during the read operation performed using the second read voltage Vread2. This may also indicate that a cell current of the first cell transistor 111 having the initialized status increases to be greater than the second cell current Icell2 due to the read disturbance. Alternatively, it may indicate that a cell current of the second cell transistor 112 having the programmed status is reduced to be less than the second cell current Icell2 due to the retention degradation. Accordingly, in order to verify whether it is correct, the second sensing output signal SA_OUT2 is not generated by the control circuit 170 and the third read process illustrated in FIG. 12 may be performed.

Referring to FIG. 12 illustrating the third read process, when the first sensing output signal SA_OUT1 has a low level at the step 428 of FIG. 11, the read operation of the second cell transistor 112 may be performed using the first read voltage Vread1 at a step 431. Subsequently, it may be determined whether the first sensing output signal SA_OUT1 has a low level at a step 432. When the first sensing output signal SA_OUT1 has a low level at the step 432, the nonvolatile memory cell 110 may be determined to have the initialized status and the control circuit 170 may output a low level signal as the second sensing output signal SA_OUT2 at a step 433. In contrast, when the first sensing output signal SA_OUT1 has a high level at the step 432, the nonvolatile memory cell 110 may be determined to have the programmed status and the control circuit 170 may output a high level signal as the second sensing output signal SA_OUT2 at a step 434.

Figure 19:
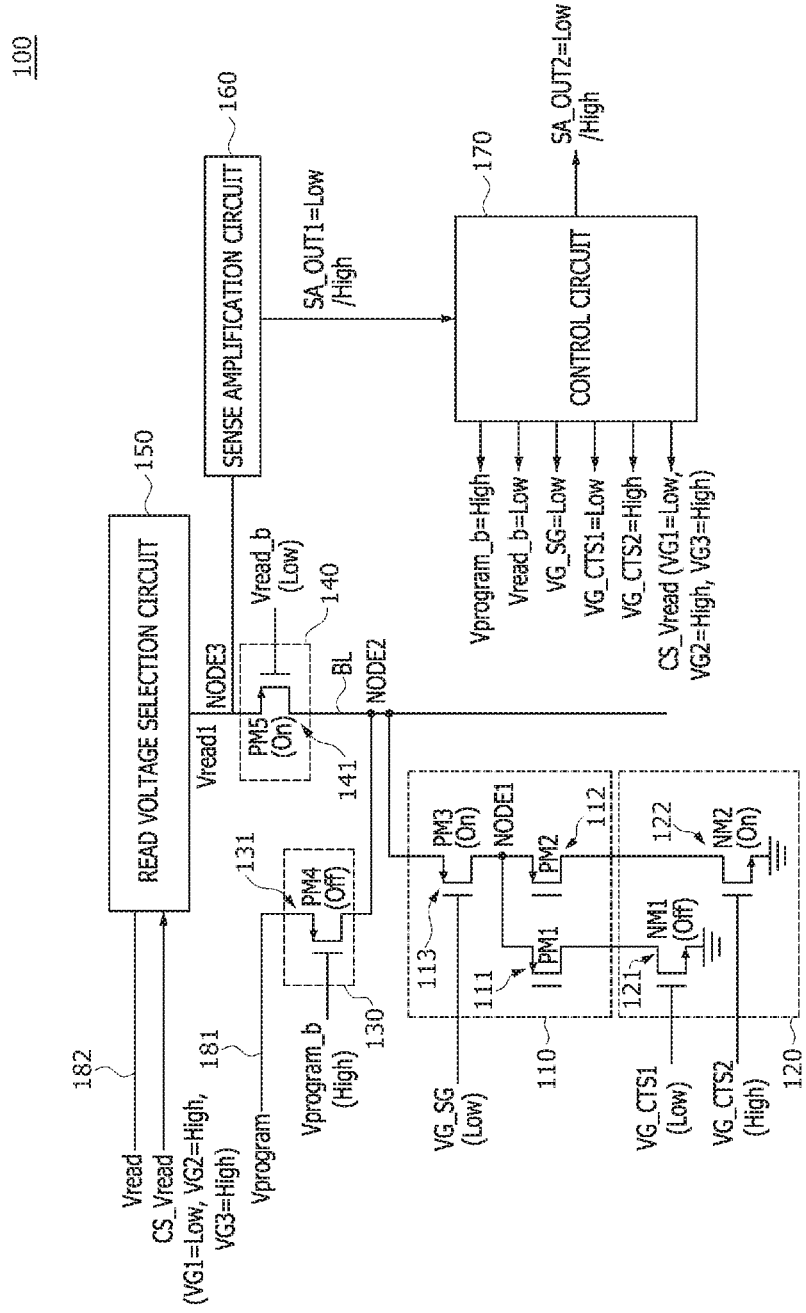

The steps 431 to 434 of FIG. 12 will be described in more detail hereinafter with reference to FIG. 19. If the first sensing output signal SA_OUT1 has a low level at the step 428 of FIG. 11, it may indicate that a cell current of the first cell transistor 111 is clearly greater than the second cell current Icell2 corresponding to the second read voltage Vread2 and a cell current of the second cell transistor 112 is clearly less than the second cell current Icell2 corresponding to the second read voltage Vread2. Thus, as illustrated in FIG. 19, the control circuit 170 may generate the program gate voltage Vprogram_b having a high level, the read gate voltage Vread_b having a low level, the selection gate voltage VG_SG having a low level, the first switching gate voltage VG_CTS1 having a low level, and the second switching gate voltage VG_CTS2 having a high level to perform the step 431 of FIG. 12. In addition, the control circuit 170 may generate and output the first gate voltage VG1 having a low level, the second gate voltage VG2 having a high level, and the third gate voltage VG3 having a high level to the read voltage selection circuit 150. Thus, while the read switching transistor 141 is turned on, the program switching transistor 131 may be turned off. In addition, while both of the selection transistor 113 of the nonvolatile memory cell 110 and the second switching transistor 122 of the cell transistor selector 120 are turned on, the first switching transistor 121 of the cell transistor selector 120 may be turned off.

The read voltage selection circuit 150 may receive the first gate voltage VG1 having a low level, the second gate voltage VG2 having a high level, and the third gate voltage VG3 having a high level to generate and output the first read voltage Vread1 through the third node NODE3 of the bit line BL, as described with reference to FIGS. 3 and 4. Because both of the read switching transistor 141 and the selection transistor 113 are turned on, the first read voltage Vread1 may be applied to the first node NODE1 of the nonvolatile memory cell 110. As the second switching transistor 122 is turned on, the first read voltage Vread1 may be applied between the source terminal and the drain terminal of the second cell transistor 112. In contrast, as the first switching transistor 121 is turned off, an open circuit may be provided between the drain terminal of the first cell transistor 111 and the ground voltage terminal.

If the second cell transistor 112 is turned off when the first read voltage Vread1 is applied to the second cell transistor 112, the third node NODE3 of the bit line BL may maintain the first read voltage Vread1. In contrast, if the second cell transistor 112 is turned on when the first read voltage Vread1 is applied to the second cell transistor 112, the third node NODE3 of the bit line BL may be grounded. When the third node NODE3 of the bit line BL maintains the first read voltage Vread1, the sense amplification circuit 160 may generate and output the first sensing output signal SA_OUT1 having a low level. In contrast, when the third node NODE3 of the bit line BL is grounded, the sense amplification circuit 160 may generate and output the first sensing output signal SA_OUT1 having a high level. The first sensing output signal SA_OUT1 outputted from the sense amplification circuit 160 may be inputted to the control circuit 170. The control circuit 170 may determine whether the first sensing output signal SA_OUT1 has a low level or a high level, as described at the step 432 of FIG. 12.

When the first sensing output signal SA_OUT1 has a low level at the step 432, it may indicate that the second cell transistor 112 exhibits a cell current which is less than the first cell current Icell1 corresponding to the first read voltage Vread1. This may also indicate that a cell current of the second cell transistor 112 is less than the first cell current Icell1 corresponding to the first read voltage Vread1 even though a cell current of the first cell transistor 111 is greater than the second cell current Icell2 corresponding to the second read voltage Vread2. There may be little possibility that a cell current of the second cell transistor 112 having the programmed status (i.e., having a cell current larger than the third cell current Icell3) is reduced to be less than the first cell current Icell1 due to the retention degradation. Thus, in such a case, a cell current of the first cell transistor 111 having the initialized status may be determined to increase due to the read disturbance. Accordingly, the control circuit 170 may finally determine the nonvolatile memory cell 110 to have the initialized status in order to output a low level signal as the second sensing output signal SA_OUT2. In such a case, a cell current of the first cell transistor 111 may be determined to be abnormally increasing due to the read disturbance.

When the first sensing output signal SA_OUT1 has a high level at the step 432, it may indicate that the second cell transistor 112 exhibits a cell current which is greater than the first cell current Icell1 corresponding to the first read voltage Vread1. This may also indicate that a cell current of the second cell transistor 112 is within the range between the first cell current Icell1 corresponding to the first read voltage Vread1 and the second cell current Icell2 corresponding to the second read voltage Vread2 even though a cell current of the first cell transistor 111 is greater than the second cell current Icell2 corresponding to the second read voltage Vread2. As mentioned above, there may be little possibility that a cell current of the first cell transistor 111 increases to be greater than the second cell current Icell2 due to the read disturbance. Thus, in such a case, a cell current of the second cell transistor 112 having the programmed status may be determined to be reduced within the range between the first cell current Icell1 and the second cell current Icell2 due to the retention degradation. Accordingly, the control circuit 170 may finally determine the nonvolatile memory cell 110 to have the programmed status in order to output a high level signal as the second sensing output signal SA_OUT2. In such a case, a cell current of the second cell transistor 112 may be determined to be reduced due to the retention degradation.

Embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. Nonvolatile memory device comprising:
a nonvolatile memory cell including a first cell transistor and a second cell transistor electrically coupled to a bit line in parallel and configured to respectively have a first physical size and a second physical size;
a cell transistor selector coupled between the nonvolatile memory cell and a ground voltage terminal to control electrical connections between the first cell transistor and the ground voltage terminal, and between the second cell transistor and the ground voltage terminal; and
a read voltage selection circuit suitable for selectively supplying one of a first read voltage and a second read voltage, to the bit line.

2. The nonvolatile memory device of claim 1,
wherein the first physical size of the first cell transistor corresponds to a first current drivability; and
wherein the second physical size of the second cell transistor corresponds to a second current drivability greater than the first current drivability.

3. The nonvolatile memory device of claim 1,
wherein the first and second cell transistors have the same channel length; and
wherein a channel width of the second cell transistor is greater than a channel width of the first cell transistor.

4. The nonvolatile memory device of claim 1,
wherein the nonvolatile memory cell further includes a selection transistor coupled between the bit line and a first node; and
wherein the first and second cell transistors are coupled to the first node, in common.

5. The nonvolatile memory device of claim 4,
wherein the first cell transistor is comprised of a first PMOS transistor having a floating gate;
wherein the second cell transistor is comprised of a second PMOS transistor having a floating gate; and
wherein the selection transistor is comprised of a third PMOS transistor.

6. The nonvolatile memory device of claim 5, wherein the first PMOS transistor, the second PMOS transistor, and the third PMOS transistor are disposed to share one active region with each other.

7. The nonvolatile memory device of claim 5,
wherein a source terminal of the first cell transistor and a source terminal of the second cell transistor are coupled to a drain terminal of the selection transistor;
wherein a drain terminal of the first cell transistor and a drain terminal of the second cell transistor are coupled to the cell transistor selector; and
wherein a source terminal of the selection transistor is coupled to the bit line.

8. The nonvolatile memory device of claim 1, wherein the cell transistor selector includes:
a first switching transistor coupled between the first cell transistor and the ground voltage terminal; and
a second switching transistor coupled between the second cell transistor and the ground voltage terminal.

9. The nonvolatile memory device of claim 8,
wherein the first switching transistor is comprised of a first NMOS transistor; and
wherein the second switching transistor is comprised of a second NMOS transistor.

10. The nonvolatile memory device of claim 9,
wherein the first and second cell transistors are comprised of a first PMOS transistor and a second PMOS transistor, respectively;
wherein a drain terminal of the first switching transistor is coupled to a drain terminal of the first cell transistor;
wherein a drain terminal of the second switching transistor is coupled to a drain terminal of the second cell transistor; and
wherein a source terminal of the first switching transistor and a source terminal of the second switching transistor are coupled to the ground voltage terminal.

11. The nonvolatile memory device of claim 1, wherein the read voltage selection circuit incudes a first load transistor and a second load transistor, both of which are coupled in parallel between a read voltage supply line for supplying a read voltage, and the bit line.

12. The nonvolatile memory device of claim 11,
wherein the first read voltage is induced at the bit line when the first load transistor is turned on;
wherein the second read voltage is induced at the bit line when the second load transistor is turned on; and
wherein the second read voltage is greater than the first read voltage.

13. The nonvolatile memory device of claim 11, wherein the first load transistor is configured to have a load resistance value which is greater than a load resistance value of the second load transistor.

14. The nonvolatile memory device of claim 11, wherein the read voltage selection circuit further incudes a third load transistor coupled between the read voltage supply line and the bit line.

15. The nonvolatile memory device of claim 14,
wherein the first read voltage is induced at the bit line when the first load transistor is turned on;
wherein the second read voltage is induced at the bit line when the second load transistor is turned on;
wherein a third read voltage is induced at the bit line when the third load transistor is turned on; and
wherein the second read voltage is greater than the first read voltage and the third read voltage is greater than the second read voltage.

16. The nonvolatile memory device of claim 14, wherein the third load transistor is configured to have a load resistance value which is less than a load resistance value of the second load transistor.

17. The nonvolatile memory device of claim 1, further comprising:
a program switch coupled between a program voltage supply line for supplying a program voltage and the bit line to supply the program voltage to the bit line during a program operation of the first and second cell transistors; and
a read switch coupled between an output line of the read voltage selection circuit and the bit line to supply a read voltage outputted from the read voltage selection circuit to the bit line during a read operation of the first or second cell transistor.

18. The nonvolatile memory device of claim 17,
wherein the program switch includes a program switching transistor comprised of a fourth PMOS transistor; and
wherein the read switch includes a read switching transistor comprised of a fifth PMOS transistor.

19. The nonvolatile memory device of claim 18,
wherein a source terminal and a drain terminal of the program switching transistor are coupled to the program voltage supply line and the bit line, respectively; and
wherein a source terminal and a drain terminal of the read switching transistor are coupled to an output line of the read voltage selection circuit and the bit line, respectively.

20. The nonvolatile memory device of claim 1, further comprising a sense amplification circuit suitable for outputting a low level signal or a high level signal according to a voltage level of the bit line during a read operation of the first cell transistor or the second cell transistor.

21. The nonvolatile memory device of claim 20, further comprising a control circuit suitable for controlling the read voltage selection circuit such that the read voltage selection circuit selectively outputs one of the first and second read voltages during the read operation of the first or second cell transistor and suitable for controlling the cell transistor selector such that one of the first and second cell transistors is selected.

22. The nonvolatile memory device of claim 21, further comprising a program switching transistor coupled between a program voltage supply line for supplying a program voltage and the bit line to supply the program voltage to the bit line during a program operation of the first and second cell transistors,
wherein the control circuit controls the cell transistor selector to electrically connect both of the first and second cell transistors to a ground voltage terminal during the program operation of the first and second cell transistors, and controls the program switching transistor to supply the program voltage to the bit line during the program operation of the first and second cell transistors.

23. The nonvolatile memory device of claim 22, further comprising a read switch coupled between an output line of the read voltage selection circuit and the bit line to supply a read voltage outputted from the read voltage selection circuit to the bit line during the read operation of the first or second cell transistor,
wherein after the program operation of the first and second cell transistors, the control circuit controls the read voltage selection circuit such that the read voltage selection circuit outputs a third read voltage greater than the second read voltage to the bit line, and controls the read switch such that program verifying operations of the first and second cell transistors are sequentially performed using the third read voltage.

24. The nonvolatile memory device of claim 21, further comprising a read switch coupled between an output line of the read voltage selection circuit and the bit line to supply a read voltage outputted from the read voltage selection circuit to the bit line during the read operation of the first or second cell transistor,
wherein the control circuit controls the cell transistor selector, the read voltage selection circuit, and the read switch to perform a first read operation for the first cell transistor using the first read voltage, to perform a second read operation for the first cell transistor using the second read voltage when a status of the first cell transistor is affected by read disturbance or retention degradation by the first read operation, and to perform a third read operation for the second cell transistor using the second read voltage when a status of the first cell transistor is affected by read disturbance or retention degradation by the second read operation.

25. A memory device comprising:

a nonvolatile memory cell including a first cell transistor having a first ratio of a first channel width to a first channel length and a second cell transistor having a second ratio of a second channel width to a second channel length, wherein the first ratio does not equal the second ratio;

a cell transistor selector suitable for electrically connecting and electrically disconnecting the first cell transistor and the second cell transistor to a ground voltage terminal;

a read voltage selection circuit suitable for performing a read operation of the first cell transistor and the second cell transistor selected by the cell transistor selector, to determine whether the nonvolatile memory cell has a programmed status or an initialized status depending on whether the first cell transistor and the second cell transistor are turned on or turned off.

* * * * *